United States Patent
Sporck et al.

(10) Patent No.: US 10,079,499 B2
(45) Date of Patent: *Sep. 18, 2018

(54) TYPE-C FACTORY AND SPECIAL OPERATING MODE SUPPORT

(71) Applicant: QUALCOMM Incorporated, San Diego, CA (US)

(72) Inventors: Christian Gregory Sporck, Campbell, CA (US); Georgios Paparrizos, Foster City, CA (US); Hector Oporta, Gilroy, CA (US); Shashank Prakash Mane, San Jose, CA (US); Bang Sup Lee, Fremont, CA (US); Thomas O'Brien, Powell, OH (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/462,592

(22) Filed: Mar. 17, 2017

(65) Prior Publication Data

US 2017/0269148 A1    Sep. 21, 2017

Related U.S. Application Data

(63) Continuation-in-part of application No. 15/072,784, filed on Mar. 17, 2016.
(Continued)

(51) Int. Cl.
*G01R 31/28* (2006.01)
*H02J 7/00* (2006.01)
(Continued)

(52) U.S. Cl.
CPC ........ *H02J 7/0052* (2013.01); *G01R 31/2834* (2013.01); *G06F 11/221* (2013.01); *G06F 13/385* (2013.01); *H02J 2007/0062* (2013.01)

(58) Field of Classification Search
CPC .... G01R 31/04; G01R 27/02; G01R 2107/00; G01R 13/6616; G01R 13/66;
(Continued)

(56) References Cited

U.S. PATENT DOCUMENTS 9,778,309 B1    10/2017 Sporck et al.
2003/0233174 A1    12/2003 Qureshi et al.
(Continued)

FOREIGN PATENT DOCUMENTS

CN    101937414 B    5/2013
CN    101931674 B    4/2014
(Continued)

OTHER PUBLICATIONS

International Search Report and Written Opinion—PCT/US2017/018217—ISA/EPO—Jun. 16, 2017.
(Continued)

*Primary Examiner* — Christine T. Tu
(74) *Attorney, Agent, or Firm* — Loza & Loza LLP

(57) ABSTRACT

Systems, methods, and apparatus for testing devices adapted for connection to other devices using universal serial bus (USB) are disclosed. Devices to be tested are caused to enter a special mode of operation when resistance measured at one or more terminals of a USB Type-C connector have values associated with the special mode of operation. One or more operations of the device are automatically initiated when the resistance coupled to the at least one terminal of the connector has a measured value that matches one of a set of resistance values maintained by the device. The one or more operations may include configuring a power management circuit based on the measured value, and entering a mode of operation that controls startup of at least one processor on the device when the measured value matches a first resistance value.

30 Claims, 14 Drawing Sheets

Related U.S. Application Data

(60) Provisional application No. 62/472,561, filed on Mar. 16, 2017.

(51) Int. Cl.
*G06F 13/38* (2006.01)
*G06F 11/22* (2006.01)

(58) Field of Classification Search
CPC . G01R 31/2834; G06F 9/4401; G06F 11/221; G06F 13/385; H01R 24/60; H01R 29/00; H02L 7/008; G11C 29/50; H02J 7/0052; H02J 2007/0062

See application file for complete search history.

(56) References Cited

U.S. PATENT DOCUMENTS

| | | | |
|---|---|---|---|
| 2005/0268127 A1* | 12/2005 | Shiba | H04N 1/00928 713/320 |
| 2009/0135638 A1* | 5/2009 | Shimizu | G11C 5/02 365/51 |
| 2013/0108063 A1 | 5/2013 | Verhoeve et al. | |
| 2015/0268688 A1 | 9/2015 | Leinonen et al. | |
| 2017/0005447 A1* | 1/2017 | Kim | H01R 13/6616 |

FOREIGN PATENT DOCUMENTS

CN 102684270 B 12/2014
WO WO-2015157892 A1 10/2015

OTHER PUBLICATIONS

International Search Report and Written Opinion—PCT/US2017/023087—ISA/EPO—Jun. 27, 2017.

* cited by examiner

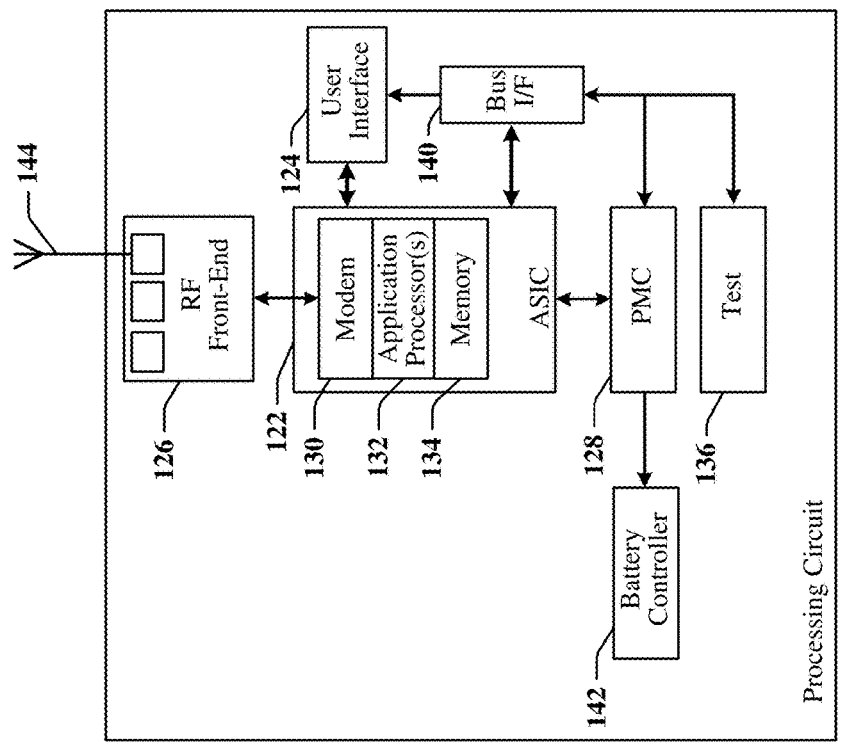
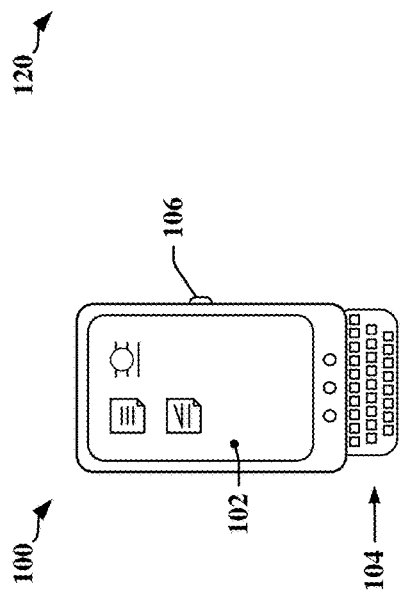
FIG. 1

| State # | Description | CC1 Rp | CC2 Rp | CC Out | ICL_Max (mA) | FMB 1 | FMB 2 | Comments |
|---|---|---|---|---|---|---|---|---|
| 0 | Debug mode not active | N/A | N/A | Float | N/A | Low | Low | Default state of FMB pins |
| 1 | Debug mode active, default USB power, UART | 3A | 1.5A | CC1 | 500 | Low | High | Charging controlled by config bit. Optionally add ICL override option to 3A for this state |
| 2 | Debug mode active, 1.5A, enable EDL and UART | 1.5A | STD | CC1 | 1500 | High | High | Charging controlled by config bit. Optionally add ICL override option to 3A for this state |
| 3 | Debug mode active, 3.0A, enable EDL | 3A | STD | CC1 | 3000 | High | Low | Charging controlled by config bit. |
| 4 | Debug mode active, 1.5A | 1.5A | 1.5A | Float | 1500 | Low | High | |
| 5 | Debug mode active, no orientation, 3.0A | 3A | 3A | Float | 3000 | Low | High | |

*FIG. 10*

TYPE-C FACTORY AND SPECIAL OPERATING MODE SUPPORT

CROSS-REFERENCE TO RELATED APPLICATION

This application is a continuation-in-part of Non-Provisional application Ser. No. 15/072,784 filed in the U.S. Patent and Trademark Office on Mar. 17, 2016, and claims the benefit of Provisional Application No. 62/472,561 filed in the U.S. Patent and Trademark Office on Mar. 16, 2017, the entire content of which applications are incorporated herein by reference.

TECHNICAL FIELD

The present disclosure relates generally to device configurations used for testing, and more particularly, to techniques for automating entry into factory test modes or special operating modes based on connector configurations.

BACKGROUND

Manufacturers of devices such as mobile communication devices may perform test procedures at various points stages during device assembly. The manufacturing process may produce sub-assemblies of various components including integrated circuit (IC) devices and System-on-Chip (SoC) devices that may include processing circuits, user interface components, storage and other peripheral components that are tested before final assembly to obtain a finished device and/or before packaging for shipment. In some instances, a device may include one or more standardized interfaces that enable the device to communicate with peripherals or other devices in normal operations, and such standardized interfaces may be used by test equipment to control and monitor testing of the device. For example, test equipment may communicate with a processing device using a standardized serial port to input control information and commands, and to receive responses indicating progress of testing and indications of success or failure of a device or subassembly under test.

As the capabilities and complexity of mobile communication devices increase, the need for improved test capabilities has increased in proportion. However, the ability to use standardized interfaces for test purposes has been inhibited due to more stringent signaling and electrical specifications necessitated, for example, by a requirement that the communications interfaces be multifunctional and usable for attaching a broader range of peripherals through more complex communications protocols. In many instances, a device or subassembly may be required to be powered-on and operational before its communication interfaces can be used to facilitate or assist in the performance of test procedures.

SUMMARY

The disclosure provided herein describes certain aspects of a device to be tested and test apparatus adapted to support automated entry into special operating modes, including factory test modes. In some examples, a resistor may be coupled to a pin or conductor associated with a connector of the device in order to initiate entry into a special operating mode. The device to be tested may be adapted to measure resistance values between two or more pins or conductors of the connector and to initiate one or more procedures based on the measured resistance values. In some instances, a power management mode for a device to be tested may be configured when a resistor with a certain resistance is coupled to a pin or conductor of the connector. Power may be received through the connector during factory test modes.

Certain aspects of the disclosure relate to systems, apparatus, methods and techniques that cause a variety of devices to enter special modes of operation by presenting a resistance between two or more pins or conductors of a connector that is adapted for communication with peripherals or other devices using a standards-defined or proprietary connector in normal use. For example, a universal serial bus (USB) connector of the device to be tested may be used to initiate factory modes of operation or other special modes of operation. Configuration of the device to be tested may be initiated automatically and autonomously when the value of the resistance is recognized as having a value associated with the factory test mode of operation or another special mode of operation. In one example, a device to be tested may be caused to enter a special operating mode by presenting a resistance across two terminals of a USB type-C connector.

In various aspects of the disclosure, a method performed by a device to be tested may include measuring a resistance between two terminals of a connector that is adapted to support USB communications, and initiating one or more operations of the device when the resistance between the two terminals has a measured value that matches one of a set of resistance values maintained by the device. The one or more operations may include configuring a power management circuit based on the measured value. The operations may include entering a factory boot mode that controls startup of at least one processor on the device based on the measured value. Each of the set of resistance values exceeds a minimum open-circuit resistance value specified for the connector.

According to certain aspects, configuring the power management circuit may involve one or more components of the device. For example, configuring the power management circuit may include disabling a battery charging circuit when the measured value corresponds to a first resistance value in the set of resistance values, and enabling the battery charging circuit to provide a charging current when the measured value corresponds to a second resistance value in the set of resistance values. Configuring the power management circuit may include configuring a direction of flow of the charging current through the connector. Configuring the power management circuit may include disconnecting a battery of the device. Configuring the power management circuit may include interrupting a battery charging circuit regardless of whether a battery is installed or connected to the device. Configuring the power management circuit may include configuring a current limit associated with one or more terminals of the connector. Configuring the power management circuit may include configuring a sequencer or sequence that controls or determines the timing or order in which power is provided to one or more components of the device or components coupled to the device.

According to certain aspects, a device may be caused to enter a mode of operation when the measured value corresponds to a first resistance value in the set of resistance values. The mode of operation may be entered by loading code through the connector into a storage device, and causing a processor of the device to execute one or more instructions from the storage device. The code may include code for an operating system adapted to control operations of the processor. The one or more instructions may initialize the operating system.

According to certain aspects, initiating one or more operations of the device includes configuring an operating mode for at least one terminal of the connector, coupling the at least one terminal to an application processor of the device when the measured value corresponds to a first resistance value in the set of resistance values, and coupling the at least one terminal to a serial communication device when the measured value corresponds to a second resistance value in the set of resistance values. Initiating one or more operations of the device may include configuring a plurality of terminals of the connector to support a USB on-the-go mode of operation or a universal serial bus dual-role mode of operation. Initiating one or more operations of the device may include initializing a test mode for the device independently of an external test system when the measured value matches one of the set of resistance values. The connector may be compliant or compatible with specifications for a USB Type-C connector.

In various aspects of the disclosure, an apparatus has a connector adapted to couple the apparatus to another device in accordance with one or more USB protocols, a measurement circuit configured to provide a measured resistance value corresponding to the resistance between two terminals of the connector, a power management circuit adapted to control power distribution within the apparatus, and a processor. The apparatus may be configured such that one or more operations are automatically initiated when the measured resistance value matches one of a set of resistance values maintained by the apparatus. One or more operations may include configuring the power management circuit based on the measured resistance value. One or more operations may include initiating a factory boot mode or factory test mode selected based on the measured resistance value. Each resistance in the set of resistance values may have a value that exceeds a minimum open-circuit resistance value specified for the connector.

According to certain aspects, the apparatus may be configured to cause the power management circuit to disable a battery charging circuit when the measured resistance value corresponds to a first resistance value in the set of resistance values, and to cause the power management circuit to enable the battery charging circuit to provide a charging current when the measured resistance value corresponds to a second resistance value in the set of resistance values. The apparatus may be adapted to configure a direction of flow of the charging current through the connector based on the measured resistance value. The apparatus may be configured to configure current limits associated with one or more terminals of the connector based on the measured resistance value. The apparatus may be configured to cause the power management circuit to implement a power sequence controlling provision of power to one or more components of the apparatus or components coupled to the apparatus.

According to certain aspects, the apparatus may be configured using a combination devices and circuits such as controllers, state machines, sequencing logic, processors and other decision-making circuits or devices that manage various modes of operation. In some instances, decision-making may be performed using circuits and devices that are embedded in functional elements of the apparatus, or implement certain functions of the apparatus, where the functions may include power management functions, timing and/or software control functions, communication functions, and the like.

According to certain aspects, the apparatus may include a processor configured to execute one or more instructions from a storage device after entering a first factory boot mode or after entering a second factory boot mode. The one or more instructions may be loaded into the storage device after the first factory boot mode is initiated. The one or more instructions may be loaded into the storage device before the second factory boot mode is initiated. The one or more instructions may include instructions related to an operating system adapted to control operations of the processor, and wherein the one or more instructions initialize the operating system.

According to certain aspects, the apparatus may configure an operating mode for at least one terminal of the connector based on the measured resistance value. For example, the apparatus may be configured to couple at least one terminal to an application processor when the measured resistance value corresponds to a first resistance value in the set of resistance values, and couple at least one terminal to a serial communication device when the measured resistance value corresponds to a second resistance value in the set of resistance values.

According to certain aspects, the apparatus may be configured to enter a test mode independently of an external test system when the measured resistance value matches one of the set of resistance values, where the connector is compliant or compatible with specifications for a universal serial bus Type-C connector.

According to certain aspects, the apparatus includes a battery. The apparatus may be configured to electrically disconnect the battery from the apparatus when the measured resistance value corresponds to a third resistance value in the set of resistance values.

In various aspects of the disclosure, a processor readable storage medium is disclosed. The storage medium may be a non-transitory storage medium and may store code that, when executed by one or more processors, causes the one or more processors to obtain a measurement of a resistance between two terminals of a connector that is adapted to support USB communications, and initiate one or more operations when the resistance between the two terminals has a measured value that matches one of a set of resistance values. One or more operations may include configuring a power management circuit based on the measured value. One or more operations may include entering a factory boot mode that controls startup of at least one processor based on the measured value. Each of the set of resistance values exceeds a minimum open-circuit resistance value specified for the connector.

In various aspects of the disclosure, an apparatus includes means for measuring a resistance between two terminals of a connector that is adapted to support USB communications, and means for initiating one or more operations of the apparatus when the resistance between the two terminals has a measured value that matches one of a set of resistance values maintained by the apparatus. The one or more operations may include configuring a power management circuit based on the measured value, and entering a factory boot mode that controls startup of at least one processor on the apparatus based on the measured value. Each of the set of resistance values exceeds a minimum open-circuit resistance value specified for the connector.

In various aspects of the disclosure, a method includes measuring a resistance coupled to at least one terminal of a connector of the communication interface, and initiating one or more operations of the device when the resistance coupled to the at least one terminal of the connector has a measured value that matches one of a set of resistance values maintained by the device. The one or more operations may include configuring a power management circuit based on the measured value, and entering a mode of operation that controls startup of at least one processor on the device when the measured value matches a first resistance value.

In one aspect, each resistance value in the set of resistance values exceeds a minimum open-circuit resistance value specified for the connector.

In another aspect, at least one terminal comprises a CC1 terminal and a CC2 terminal of a Type-C connector. The one or more operations may be initiated when resistance values measured at the CC1 terminal and the CC2 terminal correspond to different current advertisement resistance values.

In some aspects, entering the mode of operation includes loading code into a storage device, and causing a processor of the device to execute one or more instructions from the storage device.

BRIEF DESCRIPTION OF THE DRAWINGS

FIG. 1 depicts one example of an apparatus that may be adapted according to certain aspects disclosed herein.

FIG. 10 is a table that illustrates selection of factory mode testing in accordance with certain aspects disclosed herein.

DETAILED DESCRIPTION

Figure 2:
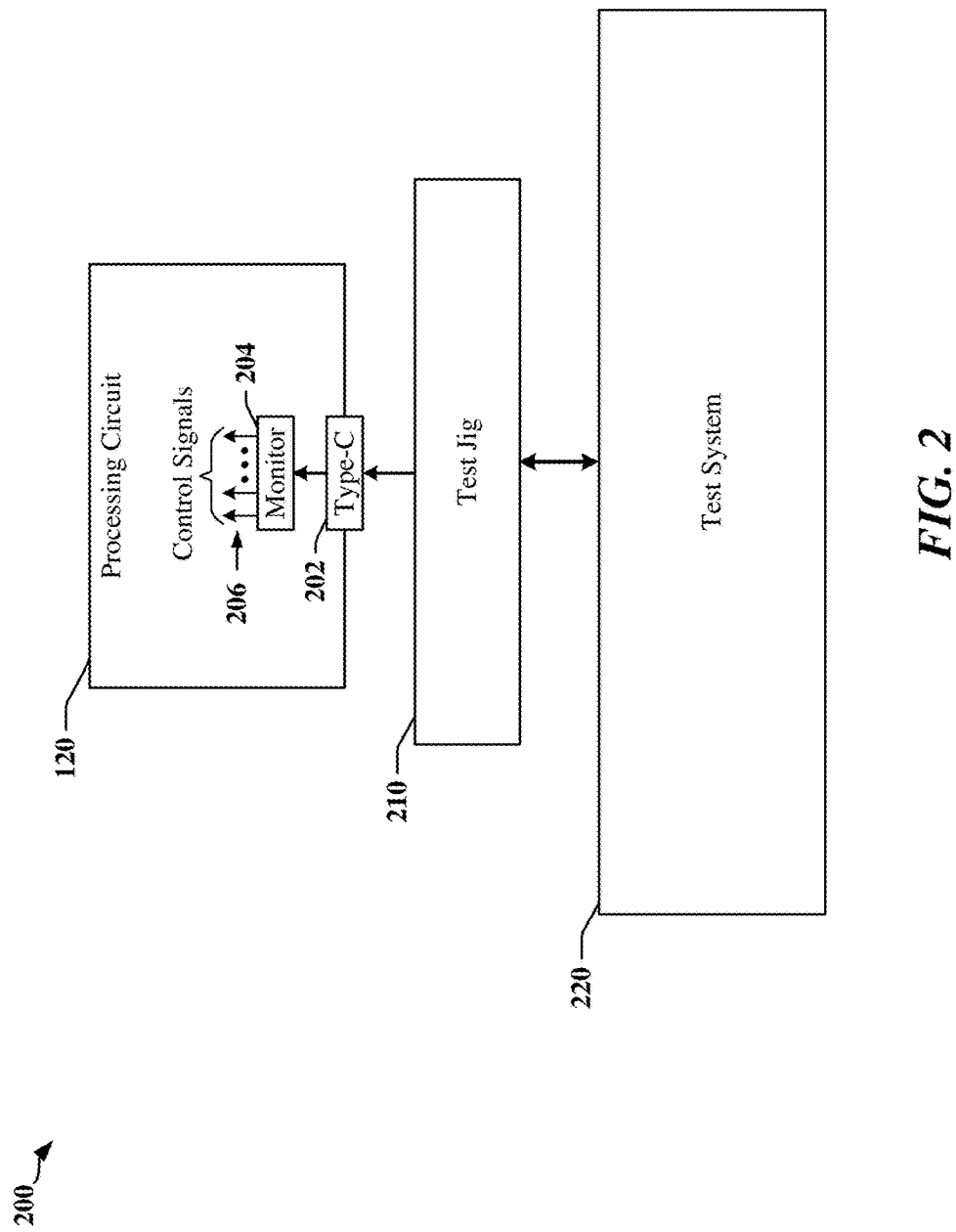
FIG. 2 is a block diagram that illustrates a test environment used for factory testing in accordance with certain aspects disclosed herein.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances well-known structures and components are shown in block diagram form in order to avoid obscuring such concepts.

Overview

Many devices include an interface that complies with, or is compatible with the USB standard. The USB standard defines physical components including cables and connectors, electrical specifications and communications protocols used for communication and provision of power over a connection between computing devices, peripherals and other electronic devices. USB interfaces are commonly found on processing devices including mobile communications devices.

Earlier implementations of USB interfaces can be adapted to facilitate factory test processes. For example, certain factory modes of operation of a device-under-test and other special modes of operation for the device may be indicated using a resistor identifier (RID). The RID may be implemented as a resistor connected to a specified identifier (ID) pin of a USB micro-connector, for example. The device-under-test may be configured to recognize the presence of a resistor on the ID pin of the USB micro-connector as one of a set of resistances associated with specific modes of operation. The value of the resistance value may indicate a type of device or peripheral, and/or a specific function to be performed. In one example, the function may relate to a factory testing mode of operation. Production test lines and test hardware and software may be developed to take advantage of the use of RIDs in a USB interface.

The USB Type-C connector is defined in later releases of USB specifications as a reversible-plug connector to be used with USB devices and USB cabling. USB specifications do not provide an ID pin on the USB Type-C connector for use in resistor detection. Instead, the USB specifications define a power-delivery protocol for the USB Type-C connector that is to be used for configuring the USB interface for different modes of operation. The power-delivery protocol may not satisfy certain requirements of manufacturers because of the limitations imposed by the use of a protocol. For example, configuring modes of operation of a device through a USB Type-C connector typically requires that the device be in a powered state and operational.

According to certain aspects disclosed herein, a USB interface may be adapted to support automated entry into special operating modes, including factory modes for example. Automated entry into a special operating mode may be achieved in a USB interface that maintains compliance with USB Type-C connector specifications. Automated entry into a special operating mode may be enabled through the use of a resistor value detection circuit configured to monitor pins of a USB Type-C connector. In some examples, a device under test may detect and measure a resistance provided between two pins of the USB Type-C connector. When the device determines that the measured resistance value corresponds to one of a set of resistance values that identify special modes of operation, the device under test may initiate one or more procedures based on the value of the measured resistance. The one or more procedures may include configuring a power management function based on the value of the measured resistance. In one example, the direction of current flow through the Type-C connector may be configured. In another example, a current limit for a current flow through the Type-C connector may be configured. In some instances, the power management function may be configured consistent with requirements or needs of a procedure to be performed in a test mode. The set of resistance values includes resistance values that exceed the minimum resistance for an open-circuit defined by the Type-C specifications. In some examples, existing test apparatus may be adapted and/or simplified by interposing a jig between the test apparatus and the device to be tested.

Several aspects of will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Example of an Apparatus with Multiple IC Device Subcomponents

Certain aspects of the invention may be applicable to to electronic devices that are subcomponents of an apparatus, and/or to the fully assembled apparatus. The apparatus may be a mobile computing device, a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, avionics systems, a wearable computing device (e.g., a smart watch, a health or fitness tracker, eyewear, etc.), an appliance, a sensor, a security device, a vending machine, a smart meter, a drone, a multicopter, or any other similar functioning device.

FIG. 1 depicts an example of such an apparatus 100. The apparatus 100 may include a processing circuit 120 having multiple devices or circuits 122, 124, 126, 128, 136, 140, and/or 142. The processing circuit 120 may be implemented in an application-specific integrated circuit (ASIC) device or SoC device that may include multiple devices or circuits 122, 124, 126, 128, 136, 140, and/or 142. In one example, the apparatus 100 may be a mobile communication device and the processing circuit 120 may include an RF front-end circuit 126 that enables the apparatus to communicate through one or more antennas 144 with a radio access network, a core access network, the Internet and/or another network.

In the example illustrated in FIG. 1, the processing circuit 120 includes an ASIC device 122 that has one or more processors 132, one or more modems 130, processor readable storage such as a memory 134, and/or other logic circuits or functions. The processing circuit 120 may be controlled by an operating system and may provide an application programming interface (API) layer that supports and the one or more processors 132 to execute software modules residing in the memory 134. The software modules may include instructions and data stored in the memory 134 and/or in different IC devices. The ASIC device 122 may access on-board memory 134 and/or memory provided external to the ASIC device 122 or processing circuit 120 that may include read-only memory (ROM) or random-access memory (RAM), electrically erasable programmable read-only memory (EEPROM), flash cards, or any memory device that can be used in processing systems and computing platforms. The processing circuit 120 may include or have access to a local database or other parameter storage that can maintain operational parameters and other information used to configure and operate the apparatus 100 and/or the processing circuit 120. The local database may be implemented using a database module, flash memory, magnetic media, EEPROM, optical media, tape, soft or hard disk, or the like. The processing circuit 120 may also be operably coupled to external devices such as the antennas 144, a display 102, operator controls, such as a button 106 and/or an integrated or external keypad 104, among other components. A user interface 124 may communicate with one or more peripherals such as the display 102, keypad 104, etc. through a dedicated peripheral communication link or through one or more general purpose peripheral communication links.

Figure 3:
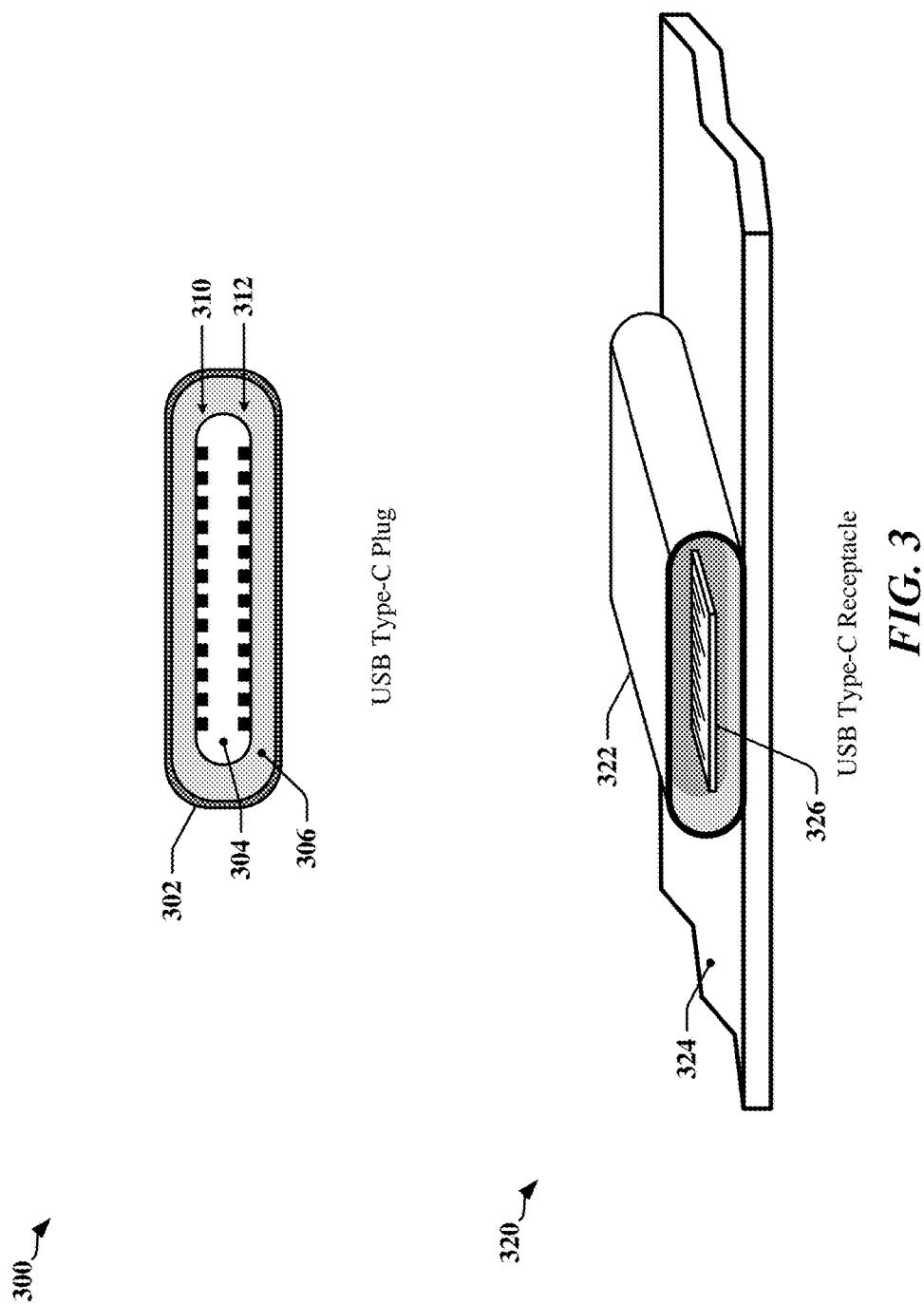
FIG. 3 illustrates examples of Type-C connectors.

The processing circuit 120 may communicate with external devices through a bus interface circuit 140, which may include control logic and a connector (see the Type-C plug 300 in FIG. 3, for example). The bus interface circuit 140 may be configured to operate in accordance with USB protocols or another protocol. The processing circuit 120 may include a power management circuit (PMC) 128 that configures and manages a battery controller 142, a user interface 124, the RF front-end circuit 126, and the operation of one or more application processors resident in the ASIC 122, for example, in certain USB modes of operation, the PMC 128 may configure the bus interface circuit 140 to set current limits and otherwise control the flow of current through the USB link. The battery controller 142 may include battery charging circuits and may be responsible for managing battery operations, including battery charging operations.

In accordance with certain aspects disclosed herein, the processing circuit 120 may be adapted such that certain devices 122, 124, 128, 136, and/or 142 in the processing circuit 120 may communicate with or through the bus interface circuit 140. Some devices 122, 124, 128, 136, and/or 142 may communicate with the bus interface circuit 140 when the processing circuit 120 is configured for a special operating mode. In some examples, the processing circuit 120 may include test circuits 136 that may be activated or enabled during factory test procedures, or in other special modes.

The apparatus 100 may implement various functions using some combination of the devices or circuits 122, 124, 126, 128, 136, 140, and/or 142. While certain functions may be fully implemented in a single device or circuit 122, 124, 126, 128, 136, 140, or 142, other the implementation of other functions may involve multiple devices or circuits 122, 124, 126, 128, 136, 140, and/or 142. In one example, a user interface may be provided using one or more of the PMC 128, the ASIC 122, or the battery controller 142.

FIG. 2 is a block diagram illustrating a test environment 200 that may be used in special modes in accordance with certain aspects disclosed herein. For example, the test environment may be adapted to enable a processing circuit 120 to be tested during manufacture. The processing circuit 120 may be coupled to a test system 220 using an adapter or a test jig 210. The test jig may 210 may be used to configure connection paths, provide a power source, and/or set electrical characteristics. In some instances, the test jig 210 may configure a test environment. When an apparatus 100 or processing circuit 120 is coupled to the test jig 210, one or more special modes may be automatically entered. In a test mode, for example, test procedures may be initiated on the processing circuit 120. Certain procedures may be initiated when power is provided to the processing circuit 120 while resistances are coupled through the test jig 210 or test system 220 to two or more terminals or pins of a connector 202 in the processing circuit 120.

In some instances, the test jig 210 may adapt an interface of a test system 220 adapted for testing devices with non-Type-C connectors for use with a device that employs a Type-C connector 202. For example, the test system 220 may be mechanically compatible with a USB micro-connector and may connect resistances to the ID pin of a USB micro-connector coupled to the test system 220. In this example, the test jig 210 may reroute certain connections between the test system 220 and the Type-C connector 202 of the processing circuit 120, provide power through the to the Type-C connector 202, and/or control signals to the Type-C connector 202. The value of a resistor connected to the ID pin of the USB micro-connector may be coupled to one or more pins of the Type-C connector 202, and/or used to select a resistance value to be coupled to one or more pins of the Type-C connector 202. In one example, the test jig 210 may determine a desired mode of operation based on the resistance value associated with the ID pin of a micro-USB connector and may indicate the desired mode of operation or an equivalent or alternative mode of operation to the processing circuit 120 by coupling a resistor to a pin of the Type-C connector 202 in accordance with certain aspects disclosed herein. The test jig 210 may also translate signal voltage levels used by the test system 220 to voltage levels compatible with the interface supported through the Type-C connector 202.

Overview of the Type-C Connector

FIG. 3 illustrates examples of Type-C connectors 300, 320. A first Type-C connector (Type-C plug 300) may be provided on a cable that mates with a second Type-C connector (Type-C receptacle 320), which may be mounted on a circuit hoard 324 or otherwise physically attached to a device. The Type-C receptacle 320 has a mid-plate 326 carrying terminals such as wires, pins, traces, pads or other means of establishing electrical connection with a mating connector. For example, the terminals of the Type-C receptacle 320 may engage with corresponding terminals of the Type-C plug 300 when the two connectors 300, 320 are mated. When connected, the mid-plate 326 of the Type-C receptacle 320 is inserted into, and surrounded by a central cavity 304 of the Type-C plug 300.

Type-C connectors can support data rates of at least 10 Gbps for data transfer and can deliver data and power simultaneously. Type-C connectors may support certain audiovisual standards, allowing the transmission of video and audio signals concurrently with data and power delivery. In some configurations, Type-C connectors can support bidirectional transmission of high-definition multimedia interface (HDMI) and video graphics array (VGA). A Type-C connector may support a USB port that can transmit up to 100 watts of power.

Figure 4:
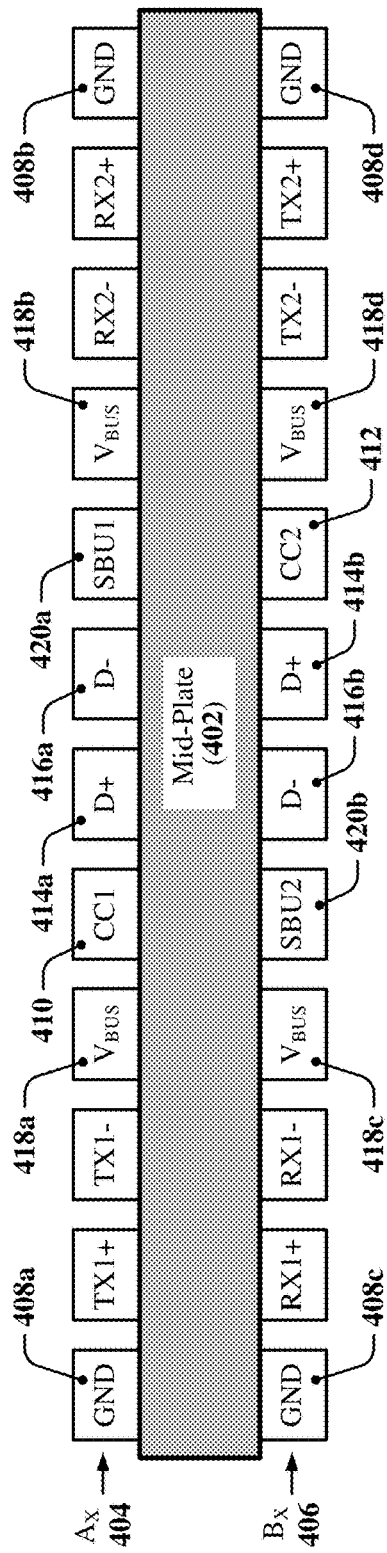
FIG. 4 illustrates an assignment of signals to terminals in a Type-C receptacle.

FIG. 4 illustrates an assignment of signals to terminals (i.e. a pinout) for a Type-C receptacle 400. The Type-C receptacle 400 has a mid-plate 402 with a first set of terminals 404 provided on one side of the mid-plate 402 and a second set of terminals 406 provided on the other side of the mid-plate 402. The pinout is configured such that Type-C connectors provides a reversible-plug connection. In the example of a USB connection, the Type-C plug 300 may be inserted into the Type-C receptacle 320 in either of two possible orientations. Specifications governing the implementation and operation of the Type-C connector define a minimum open-circuit resistance value for the terminals of the Type-C connector as 127 kΩ.

Automatic Initiation of Factory Mode Using a Type-C Connector

According to certain aspects disclosed herein, factory and other special modes of operation may be automatically initiated through a Type-C connector by providing resistances between one or more terminals of a Type-C connector and ground. For example, a device to be tested may enter a factory test mode of operation or another special mode of operation after measuring the value of any resistances coupled to one or more terminals of the Type-C connector. The device to be tested may be preprogrammed or preconfigured to recognize the resistance between a terminal of the Type-C connector and ground, or a combination of resistances provided between ground and multiple terminals of the Type-C connector. The mode of operation may be selected based on the measured resistance values between designated terminals of the Type-C connector and ground.

In some instances, the resistances used to cause automatic initiation of factory modes and other test modes are selected to exceed the minimum open-circuit resistance value defined by specifications for the Type-C connector, which is 127 kΩ in some instances. A device to be tested may be adapted to measure the resistance to ground at various terminals of the Type-C connector to determine if the resistance exceeds 127 kΩ and to determine if the resistance has a value that is associated with a factory test mode of operation or another special mode of operation. In some examples, a plurality of modes of operation may be initiated based on the value of resistance measured at a terminal of the Type-C connector. In some examples, a mode of operation may be indicated when a recognized combination of resistance values is measured at two or more terminals of the Type-C connector.

When resistances measured on a combination of one or more terminals correspond to a recognized set of resistance values, the device may configure the functionality associated with a Type-C connector to support the desired mode of operation. In one example, the device may configure power management settings, including direction of current flow, current limit and charging status. In the example of a mobile device that does not have a battery installed when it is being tested at the factory, the mobile device may disable charging in factory test mode and may configure the power management settings such that the mobile device receives sufficient power through the Type-C connector to perform various functions in one or more test modes of operation.

In another example, an emergency download mode (EDL) may be initiated by one recognized set of resistance values RID is measured at terminals of the Type-C connector. The EDL may include disabling charging, configuring current limits to enable software download and memory write operations, operating system downloads, device driver download or configuration, other software/firmware downloads or configuration, and/or performing a system boot.

Certain features that may be automatically configured based on RID may include input current limit levels, charging enable/disable control, certain analog signals used by the system, Type-C connector D+/D− signal connection, selection of digital signals used by the system, power sequencing, control of an external FET to enable direct connection of a bus supply $V_{bus}$ or other I/O terminals to a battery voltage ($V_{batt}$) during factory modes of operation. Other features that may be automatically configured include On-the-Go (OTG) modes, dual-role port or other reverse power settings and support status. OTG modes enable USB devices to act as a host device for other USB devices, such as flash drives, digital cameras, user interface devices, etc. A dual-role device may be capable of operating as a supplier of power in a first role, and may receive power in a second role. A device that supports OTG modes is implicitly a dual-role device. The control circuit and/or monitor 204 may define output current limit levels for OTG modes of operation.

Table 1 illustrates one example of a set of resistance values that may be recognized by a device to be tested when coupled to a terminal of a Type-C connector in accordance with certain aspects disclosed herein. It will be appreciated that different implementations may use different combinations of resistance values. For example, devices to be tested may be adapted or configured to respond to different resistance values and/or to respond to a larger or smaller number of resistance values. Table 1 is illustrative of a single example of many possible examples.

TABLE 1

| Resistance Value | Mode A (FMB$_1$) | Mode B (FMB$_1$) | Mode C (UART) |
|---|---|---|---|
| 255 kΩ | Low | Low | Low |
| 301 kΩ | High | Low | Low |
| 523 kΩ | Low | Low | High |
| 619 kΩ | High | Low | High |
| Other | Low | Low | Low |

In the example illustrated in Table 1, four resistance values are identified as designated resistances that cause a device to be tested to initiate one or more functions when recognized by the device. The presence of a resistance on a specified terminal of the Type-C connector may generate multiple signals and/or cause different functions to be initiated, in accordance with a test mode configured for the device under test. The test mode (Mode A or Mode B) may be defined based on the type of device to be tested, the manufacturer of the device and/or the stage of manufacture of the device to be tested.

With continued reference to FIGS. 2 and 4, a control circuit and/or monitor 204 may be configured to measure resistances between certain terminals and ground (GND 408a, 408b, 408c or 408d), and to determine whether such resistances have values that correspond to designated resistance values used to initiate factory test modes. In one example, the resistance associated with the CC1 terminal 410 and/or CC2 terminal 412 may be measured. The control circuit and/or monitor 204 may generate one or more control signals 206 that enable a special operating mode. In the example where the special mode is a factory test mode, the control circuit and/or monitor 204 may initiate or control functions and operations of the device to be tested while factory mode is enabled.

In one example, a device to be tested may enter one or more factory test modes of operation, and one or more test functions may be initiated when the control circuit and/or monitor 204 determines that a resistance measured at a terminal 410, 412 of the Type-C connector 202 has a recognized or designated resistance value. The value of the measured resistance may determine the logic state of one or more control signals 206, in the example illustrated in Table 1, two types of factory-mode hoot (FMB) are identified. A type of FMB may be selectively initiated based on the value of a measured resistance coupled to a terminal of the Type-C connector 202. In a first example, Mode A of the example illustrated in Table 1 may relate to an EDL mode, and the control circuit and/or monitor 204 may provide a signal that initiates a first FMB that causes an emergency download or indicates that an emergency download is requested. The emergency download may provide code for device drivers, an operating system, control functions and/or one or more application to be installed on the device to be tested. In a second example, Mode B of the example illustrated in may relate to a second FMB, which causes the control circuit and/or monitor 204 to provide a signal that initiates a device reset and/or indicates that a factory mode reset is requested. Other signals may be generated as necessary to perform desired test functions. In the example illustrated in Table 1, each of the recognized resistance values triggers the second FMB and the control circuit and/or monitor 204 may initiate a reset (boot) of the PMC. Some resistance values trigger the first FMB mode and the control circuit and/or monitor 204 may initiate an EDL. Entry into a factory or special mode of operation may be initiated by some combination of functional elements in a device to be tested. In one example, detection, control and/or decision-making may be implemented in a single device or circuit, such a the ASIC 122. In another example, detection, control and/or decision-making may be implemented using one or more components of the processing circuit 120, such as an application processor 132, a PMC 128, a battery controller 142, a riser interface 124, a bus interface 140, an RE front-end 126, and/or specialize test circuits and devices 136.

Other modes of operation may be selectively enabled based on the value of a resistance measured at a designated terminal of the Type-C connector 202. In a third example, a serial port mode (Mode C) of the example illustrated in Table 1 may be enabled when certain resistance values are measured at the designated terminal. For Mode C operations, the control circuit and/or monitor 204 may generate one or more control signals 206 that enable or configure a universal asynchronous receiver/transmitter (UART), and/or that configure data communication paths between the processing circuit and the Type-C connector 202.

According to certain aspects, the control signals generated by the control circuit and/or monitor 204 may include digital signals and/or analog signals. Factory modes may be initiated using an input/output (I/O) signal, an interrupt signal, or some combination of I/O and interrupt signals. A device coupled to a test system 220 may automatically and autonomously initiate one or more factory test modes upon detecting a recognized resistance coupled to the Type-C connector 202. That is, the device to be tested may initiate a factory test mode, including configuring a PMC without receiving a command from the test system 220 and without initializing an application processor 132 on the processing circuit 120. In some instances, an operating system or control program may not be available on the processing circuit 120 until an emergency download initiated in response to detection of a recognized resistance value has been performed.

According to certain aspects, the device to be tested may initiate entry into special modes, including one or more factory test modes, without using power delivery protocols. Power delivery protocols in USB specifications for devices that employ Type-C connectors require that mobile devices be powered and booted before factory test modes are initiated, which presents a challenge in factory testing environments where the device to be tested does not yet have a battery installed. Certain aspects disclosed herein provide methods, apparatus and techniques in which the device to be tested is provided with power, and then reset and/or configured for various test modes without the use of USB standards-based utilities and functions. The device to be tested may be adapted to ensure proper configuration of the device and interface circuits coupled to the Type-C connectors during test modes and special modes of operation to enable certain test procedures to be performed in cooperation with the test system 220. In one example, the processing circuit 120 may be configured with a downstream facing port (Host) or with an upstream facing port as indicated by a configured FMB mode.

According to certain aspects, the test system 220 or the test jig 210 provides a device to be tested with power through the Type-C connector 202. The power enables the control circuit and/or monitor 204 to initiate one or more special modes, including FMB modes. In one example, an FMB mode may cause the PMC to implement a power control configuration that enables other FMB modes and other test functions. For example, the power control configuration may define direction of current flow between the processing circuit 120 and the test system 220. The power control configuration may define input current limit levels. The power control configuration may place the battery charging circuit in an enabled state, a disabled state or in a standby state. For example, the power control configuration may cause the device to be tested to enable and/or control an external gate such as a field effect transistor (FET) that directly connects the $V_{BUS}$ terminals 418a, 418b, 418c, 418d (or other terminals) to a battery charging source in some FMB modes. The power control configuration may also configure power sequencing used to power-up the processing circuit 120 and/or other devices coupled to the processing circuit 120.

The control circuit and/or monitor 204 may configure other aspects of the device to be tested and/or constituent elements of the processing circuit 120. In one example, the control circuit and/or monitor 204 may define and configure certain analog signals to be used by the device to be tested during factory test. In another example, the control circuit and/or monitor 204 may define and configure certain digital signals to be used by the device to be tested during factory test. In another example, the control circuit and/or monitor 204 may configure the connections and control of the data terminals (D+ terminal 414a, 414b and D– terminal 416a, 416b) of the Type-C connector 202.

The control circuit and/or monitor 204 may enable or configure USB on-the-go (OTG) modes of operation, including initiating a reverse power mode of operation.

Example of a Process for Automatically Configuring Special Modes

Figure 5:
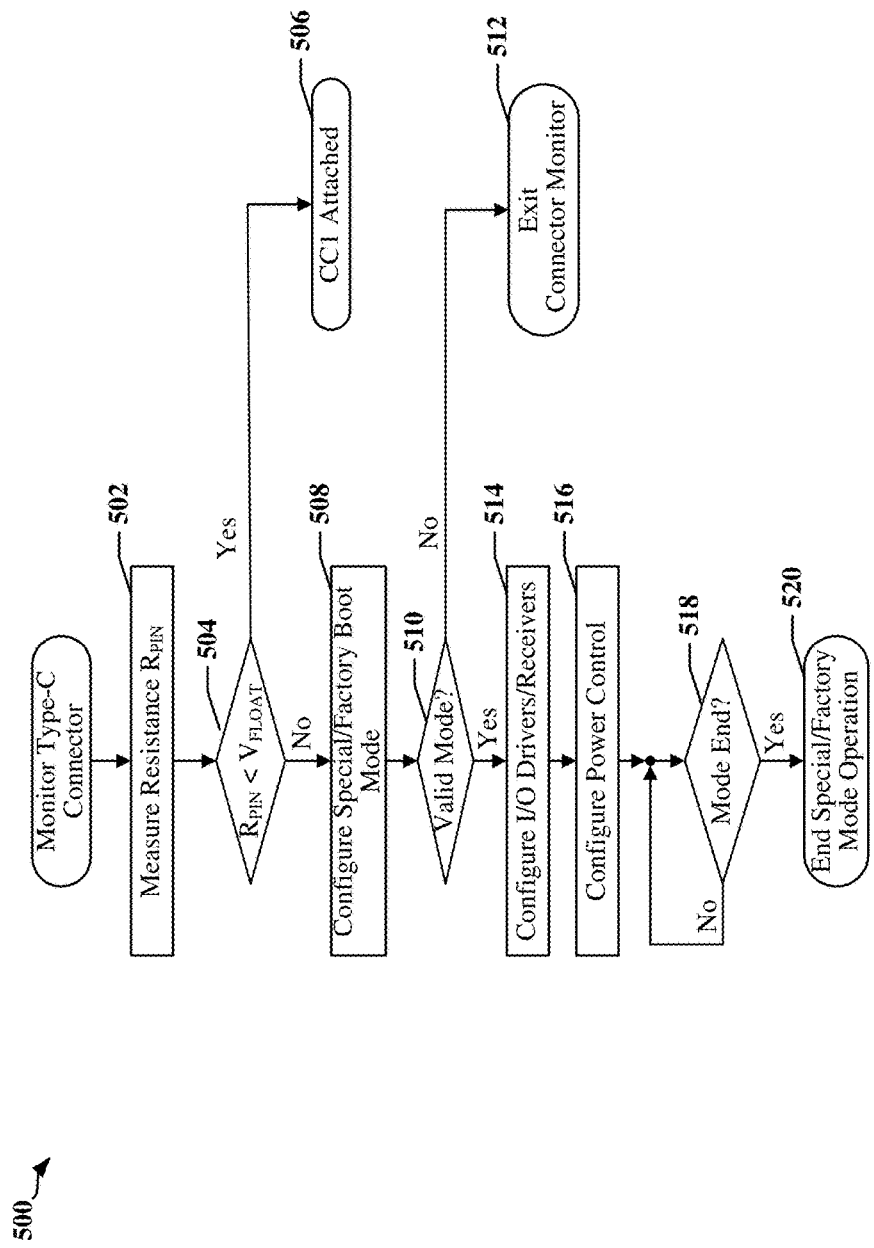
FIGS. 5-7 are flowcharts that illustrate an example, in which a factory mode configuration process is triggered by a resistance connected to a terminal of a USB Type-C interface in accordance with certain aspects disclosed herein.
Figure 6:
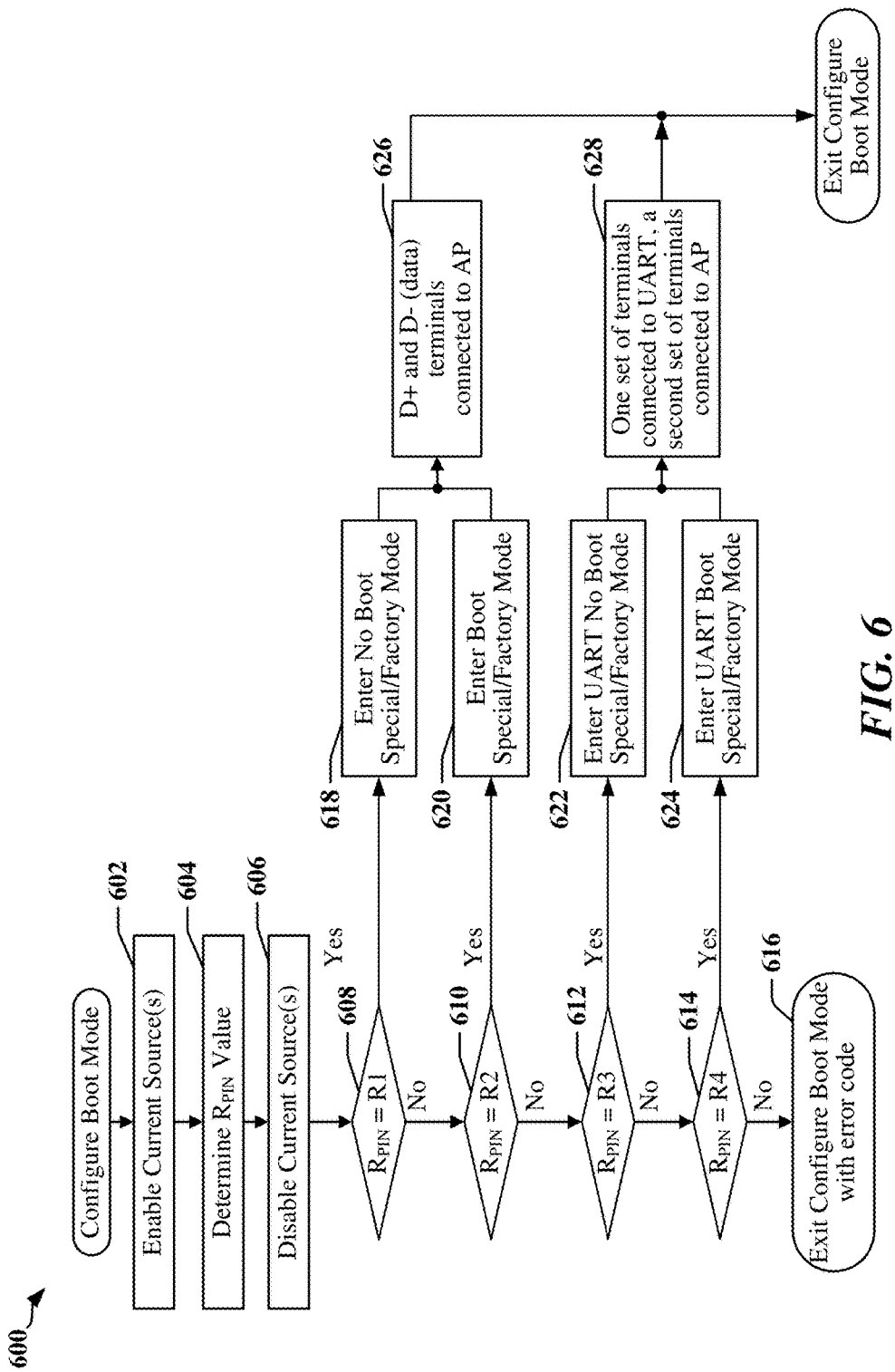
Figure 7:
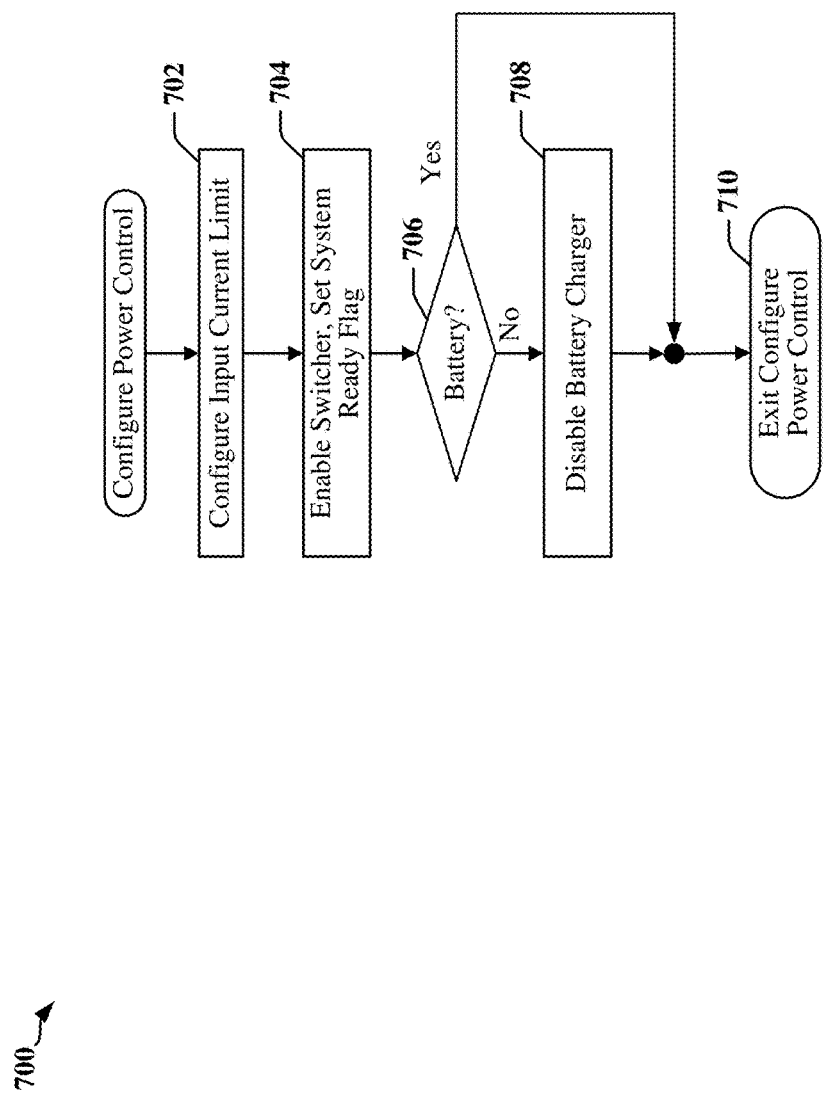

FIGS. 5-7 provide flowcharts 500, 600, 700 that illustrate a process whereby a device may initiate a special mode of operation or a factory mode of operation when a recognized resistance value is presented between two pins of a connector of the device. The connector may have any physical shape or structure and may be adapted for communications in accordance with standards-defined or proprietary protocols. To facilitate description, the flowcharts 500, 600, 700 relate to a special operating mode that may be a factory mode. The flowcharts 500, 600, 700 describe aspects of a configuration process that may be initiated when a device to be tested detects and/or measures a resistance value connected to a terminal of the Type-C interface in accordance with certain aspects disclosed herein. Certain aspects and concepts are applicable to other special modes, types of connector, communication interfaces, and protocols. The configuration process may be performed using one or more devices or circuits 122, 124, 126, 128, 136, 140, and/or 142 in a processing circuit 120. The configuration process may be implemented using a combination of hardware circuits, software and configurable circuits or modules.

At block 502 in the flowchart 500 of FIG. 5, the device to be tested may detect the presence of a resistance coupled to a terminal of the Type-C connector 202 by measuring the resistance of one or more terminals of the Type-C connector 202. In one example, the device to be tested may employ a circuit that determines whether the resistance coupled to one or more terminals of the Type-C connector 202 exceeds a minimum resistance threshold value indicating an open-circuited terminal of the Type-C-connector 202. In the example of a Type-C connector 202, the device to be tested may periodically monitor the CC1 terminal 410 and/or the CC2 terminal 412 by enabling one or more current sources coupled to the terminals 410 and/or 412. A test system 220 or test jig 210 may provide different resistance values on the CC1 terminal 410 and/or the CC2 terminal 412 or on related terminals of other types of reversible connector, in order to select different modes of operation based on orientation of the reversible connector. A test system 220 or test jig 210 may provide additional information encoded in the combination of resistance values connected to the CC1 terminal 410 and/or the CC2 terminal 412 or on related terminals of other types of reversible connector, such that the device to be tested may initiate different variants of a test or special mode of operation, for example.

The resistance value $R_{PIN}$ may be measured using circuits that provide a comparison of the voltage at the terminals 410 and/or 412 to voltage levels corresponding with a set of resistance values recognized by the processing circuit as special mode or factory-mode initiators. The set of resistance values may be represented as voltage levels for comparison, or may be provided as physical resistances installed on, or coupled to the processing circuit. In one example, the voltage at the terminals 410 and/or 412 may be compared to a maximum and minimum voltage associated with each of the recognized resistance values. The processing circuit may also respond to measurements indicating that the resistance or resistances associated with the terminals 410 and/or 412 is less than the minimum resistance value for an open-circuited terminal of the Type-C connector 202, which may be 127 kΩ.

At block 504, the device to be tested may select a next step based on whether the measured resistance value $R_{PIN}$ exceeds the minimum resistance value for an open-circuited terminal of the Type-C connector 202. In one example, the resistance value of the CC1 terminal 410 is measured, and if lower than 127 kΩ, the device to be tested may determine that the Type-C connector 202 is unconnected or connected to a device that is not a test system 220 or test jig 210 and the device to be tested may initiate one or more normal connection modes of operation at block 506. If the resistance value measured at the CC1 terminal 410 is greater than 127 kΩ, then the process continues at block 508.

At block 508, the device to be tested may configure a special mode boot, which may be a factory mode boot. An example of a process for configuring a factory mode boot is illustrated in FIG. 6. In some instances, the resistance value on the CC1 terminal 410 (or another terminal) may unrecognized by the device to be tested, and boot mode configuration may end with an error code that indicates an invalid special/factory mode hoot configuration. Accordingly, the device to be tested may determine at block 510 that a special mode such as a factory mode is not to be entered, and may exit the connector monitoring process at block 512.

If the device to be tested configures a valid special/factory mode boot, then at block 514, various drivers, receivers and connections may be configured. For example, drivers and receivers may be selected to drive and receive signals through corresponding terminals of the Type-C connector 202 based on the special/factory mode boot configured in block 510. In some instance, analog and digital signals may be set to a state defined by a special/factory mode selected based on one or more identified resistors. In some examples a monitoring circuit or function in the device to be tested may generate control signals 206, commands, interrupts, messages, etc. to initiate one or more test mode functions or other special mode functions.

At block 516, the device to be tested may configure the PMC 128, the battery controller 142 and other devices (see FIG. 1) in the processing circuit 120. The device to be tested may then perform one or more power management functions related to a special/factory mode of operation. In one example, the PMC 128 may be configured to control a direction of power flow through the Type-C connector 202 defined by the selected special/factory mode. The PMC 128 may implement or configure a power sequence based on the value of one or more identified resistors. The PMC 128 or battery controller 142 may cause a battery circuit to be disconnected from the processing circuit 120 such that, in one example, a battery may be disconnected and the processing circuit 120 may be powered through the Type-C connector 202.

At block 518, the device to be tested may continue to monitor the Type-C connector 202 and signals or messages produced during special/factory mode testing to determine when special/factory mode should be terminated. If it is determined that the Type-C connector 202 has been disconnected from the test jig 210 and/or test system 220, then the device to be tested may exit special/factory mode operation at block 520. In one example, special/factory mode may terminate when power is removed from the Type-C connector 202. In another example, a command or message generated by test software executed on the processing circuit 120 or in the test system 220 may indicate that special/factory mode operations should be terminated.

The flowchart 600 of FIG. 6 illustrates an example of a process used to configure a boot mode for special modes of operation, including factory modes of operation. The illustrated process may be an example of the process performed in block 510 of FIG. 5.

At block 602, one or more current sources may be enabled to permit measurement of the resistance between two or more pins of the Type-C connector 202. A current source may be disabled between repetition of the hoot mode configuring process when, for example, when the process is repeated for each of a plurality of terminals in the Type-C connector 202 or repeated periodically. In such instances, the current source may be disabled to conserve power. In other examples, the current source may be enabled when an external power supply is coupled to the Type-C connector 202 and the current source may be configured at block 602.

At block 604, the device to be tested may determine the $R_{PIN}$ resistance value. In one example, a measurement of the $R_{PIN}$ resistance value may be provided as an input to the process illustrated in FIG. 6. In another example the device to be tested may enable one or more circuits used to measure the $R_{PIN}$ resistance. The device to be tested may maintain parameters that enable the device to be tested to recognize the values of a set of resistances that cause a device to enter a factory mode mode of operation or other special mode of operation. As illustrated in FIG. 6, the set of resistances includes four resistance values {R1, R2, R3, R4}, which may correspond to the resistances illustrated in Table 1, such that {R1=255 kΩ, R2=301 kΩ, R3=523 kΩ, R4=619 kΩ}.

At block 606, and after measuring the $R_{PIN}$ resistance, the device to be tested may disable the current source or current sources used to measure the resistance on various terminals of the Type-C connector 202. The device to be tested may determine if the measured value of the $R_{PIN}$ resistance corresponds to one of the set of resistance values recognized by the device to be tested. In one example, a measured resistance value corresponds to recognized resistance value when the value of $R_{PIN}$ lies within the percentage tolerance specified for corresponding resistors provided in a test system 220 or test jig 210.

At block 608, the device to be tested may determine if $R_{PIN}$ has a resistance value corresponding to the value of R1. If the resistance value of $R_{PIN}$ corresponds to R1, then the device to be tested may configure a factory test mode of operation at block 618 without performing an emergency download, and may connect data terminals (e.g. the D+ and D− terminals 414a or 414b of the Type-C connector 202) to an application processor of the processing circuit 120 at block 626 before exiting boot mode configuration. If the resistance value of $R_{PIN}$ does not correspond to R1 then the device to be tested may proceed to block 610.

At block 610, the device to be tested may determine if $R_{PIN}$ has a resistance value corresponding to the value of R2. If the resistance value of $R_{PIN}$ corresponds to R2, then the device to be tested may configure a special/factory test mode of operation at block 620 that includes performing an emergency download, and may connect data terminals (e.g. the D+ and D− terminals 414a or 414b of the Type-C connector 202) to an application processor of the processing circuit 120 at block 626 before exiting hoot mode configuration. If the resistance value of $R_{PIN}$ does not correspond to R2, then the device to be tested may proceed to block 612.

At block 612, the device to be tested may determine if $R_{PIN}$ has a resistance value corresponding to the value of R3. If the resistance value of $R_{PIN}$ corresponds to R3, then the device to be tested may configure a special/factory test mode of operation at block 622 without performing an emergency download, and may the application processor to a first set of terminals and a UART to a second set of terminals (of the Type-C connector 202, for example) at block 628 before exiting hoot mode configuration. If the resistance value of $R_{PIN}$ does not correspond to R3, then the device to be tested may proceed to block 614.

At block 614, the device to be tested may determine if $R_{PIN}$ has a resistance value corresponding to the value of R4. If the resistance value of $R_{PIN}$ corresponds to R4, then the device to be tested may configure a special/factory test mode of operation at block 624 that includes performing an emergency download, and may the application processor to a first set of terminals and a UART to a second set of terminals (of the Type-C connector 202, for example) at block 628 before exiting boot mode configuration. If the resistance value of $R_{PIN}$ does not correspond to R4, then the device to be tested may proceed to block 616.

When it is determined that $R_{PIN}$ is not a recognized resistance value, then at block 616, the device to be tested may terminate the boot mode configuration with an error code or other indication that a valid factory mode resistance value was not measured at a designated terminal of the Type-C connector 202.

The flowchart 700 of FIG. 7 illustrates an example of a process automatically invoked to configure a power control configuration for factory modes of operation after a recognized resistance value is measured at a designated terminal of the Type-C connector 202. The illustrated process may be an example of the process performed in block 516 of FIG. 5. The process may be performed using one or more components of the processing circuit 120. For example, a device to be tested may cause a PMC 128 and/or a battery controller 142 to implement various functions initiated during power control configuration.

At block 702, the device to be tested may configure an input current limit for the Type-C connector 202.

At block 704, the device to be tested may enable and/or initiate power conversion switchers and other circuits that manage and regulate power supplies for the processing circuit 120 and other devices coupled to the processing circuit 120.

At block 706, the device to be tested may determine whether a battery or other rechargeable power source is connected or coupled to the processing circuit 120 if a rechargeable power source is coupled to the processing circuit 120, then the process may continue or exit as completed at block 710. If no rechargeable power source is coupled to the processing circuit 120, then the process continues at block 708. In some instances, a battery connection or rechargeable power source connection is interrupted when a factory or other special mode of operation is initiated, regardless of whether a battery or other rechargeable power source is present.

At block 708, the device to be tested may disable battery charging circuits. In some instances, the processing circuit may disable charging by opening a switch, which may be implemented using an FET, for example. In some instances, disabling the battery charger is accomplished by disconnecting a battery or interrupting a battery connection to the processing circuit. Battery charging may be disabled regardless of whether a battery or other rechargeable power source is present.

According to certain aspects disclosed herein, portable devices utilizing a Type-C or a proprietary connector may be adapted to enable factory and other special modes by providing a resistor detection scheme to identify a desired mode of operation. In some instances, factory and other special modes of operation of the portable device can be configured without requiring the portable device to implement USB Power Delivery specifications or other complex specifications.

In some examples, charging mode can be automatically controlled and configured for enabled, disabled, standby modes based on resistor value. Other mode detection techniques and devices may be provided in hardware to trigger automatic configuration of charging mode.

In some examples, input current and/or output current limits can be automatically configured and controlled in charging modes and in reverse boost mode (e.g., OTG modes) based on resistor value and/or mode detection.

In some examples, input voltage and power may be configured and controlled (enable/disable) and/or power sequencing may be configured and controlled based on resistor value and/or mode detection.

In some examples, logic signals may be configured and/or controlled based on resistor value and/or mode detection. Analog (I/O) signals and digital signals may be configured or controlled.

In some examples, connection and/or routing of USB signals and other signals may be configured or controlled, based on resistor value and/or mode detection.

In some examples, hardware may be adapted to support autonomous control of system hoot and charger features, thereby reducing time required for system test.

Automatic Factory Mode Testing Using Type-C SINK Debug Accessory Mode

Figure 8:
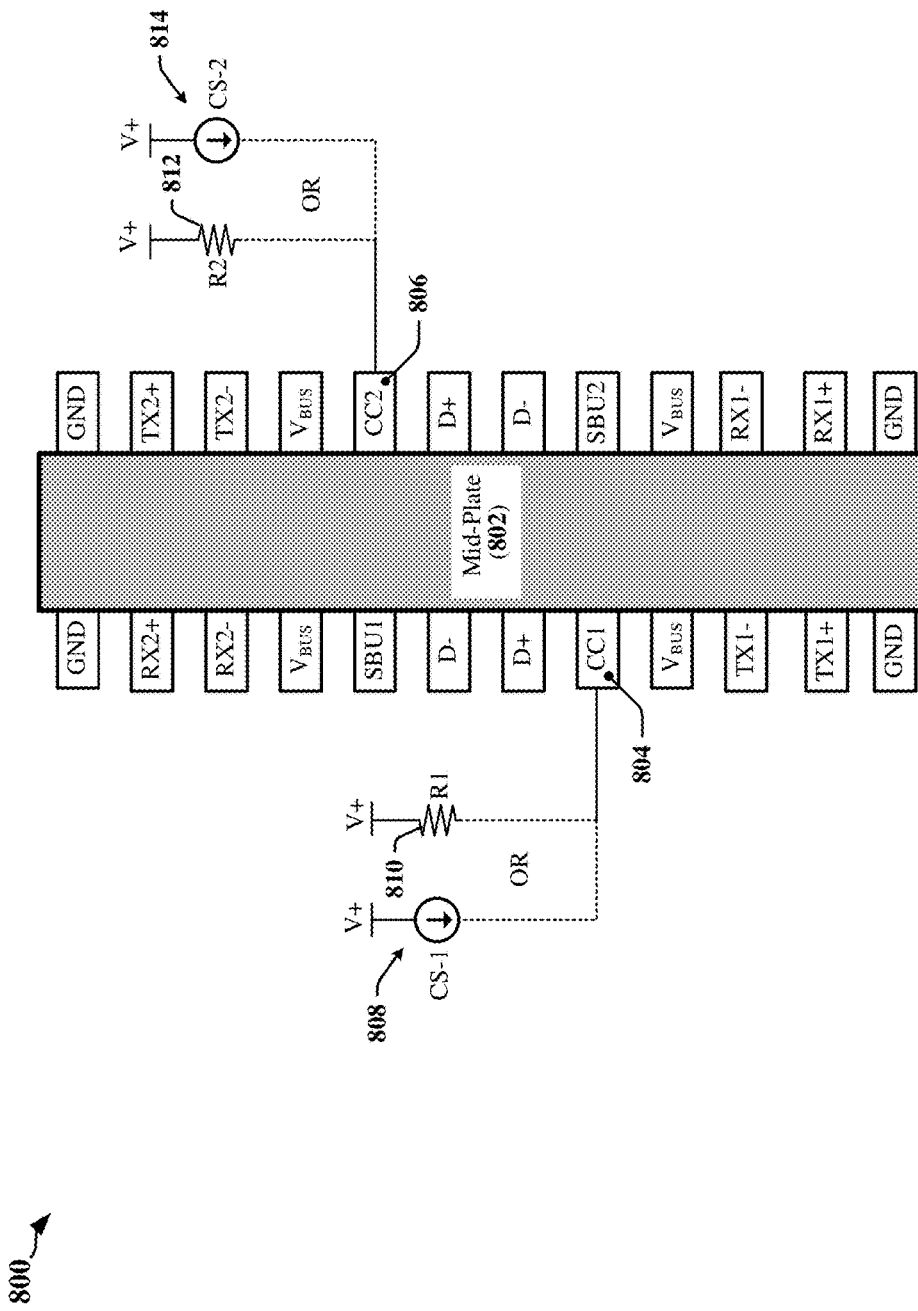
FIG. 8 illustrates a factory mode configuration process triggered by a resistance connected to CC terminals of a USB Type-C interface in accordance with certain aspects disclosed herein.

FIG. 8 illustrates a configuration adapted according to certain aspects disclosed herein that may enable automatic factory mode testing to be initiated upon detection of one or more resistance values or equivalent current sources at certain pins that are defined by specification or standards for a Type-C connector 800. In this example, resistances 810, 812 or current sources 808, 814 coupled to the CC1 terminal 804 and the CC2 terminal 806 may be configured to cause automatic factory mode testing to be initiated. A Type-C debug accessory SINK mode may be provided by configuring resistance values (Rp-std, Rp-mid, Rp-high) used for current advertisements. A device that is a current sink may enter test mode after it has been connected to test equipment and detects current advertisement resistances on both the CC1 terminal 804 and the CC2 terminal 806. According to certain aspects disclosed herein, combinations of the Rp-std, Rp-mid, Rp-high resistance values coupled to the CC1 terminal 804 and the CC2 terminal 806 may be used to indicate a test mode to be entered.

Figure 9:
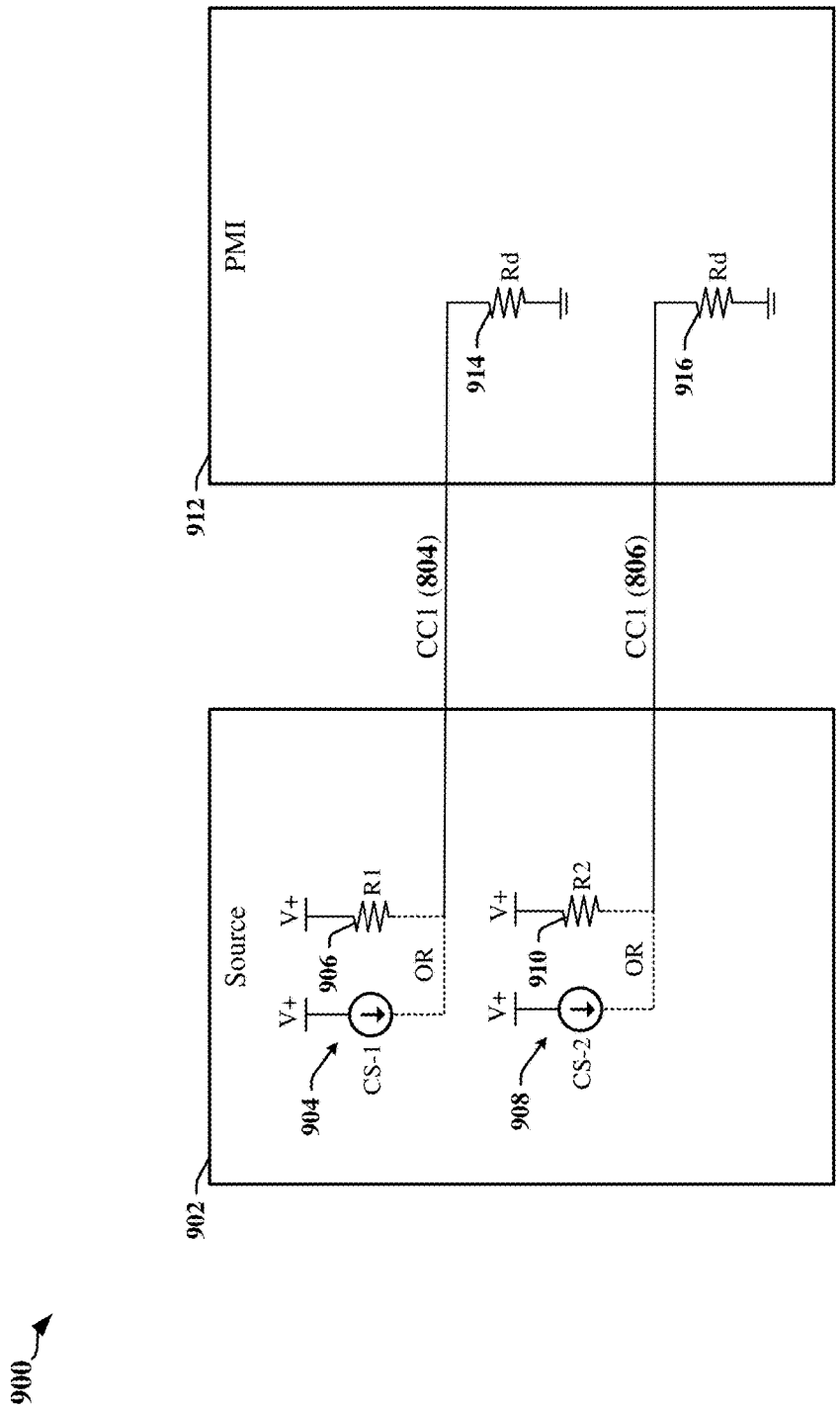
FIG. 9 illustrates CC terminal configuration of a USB Type-C interface in accordance with certain aspects disclosed herein.

FIG. 9 illustrates an interface 900 that employs the CC1 terminal 804 and the CC2 terminal 806 for automatic factory mode testing. A power management IC (PMI 912) may be coupled to a source circuit 902 on test equipment through the CC1 terminal 804 and the CC2 terminal 806. In Type-C SINK Debug Accessory Mode, the PMI 912 may employ pulldown resistors 914, 916 (Rd) that have 5.1 kΩ resistance. The PMI 912 may include circuits that sense when a pullup or current source is coupled to the CC1 terminal 804 and the CC2 terminal 806. In one example, the PMI 912 may be adapted to detect a current flow through the CC1 terminal 804 and the CC2 terminal 806. In another example, the PMI 912 may be adapted to detect a voltage level on the CC1 terminal 804 and the CC2 terminal 806. Orientation of a Type_C connector and/or a Type C cable may be identified by determining the higher of the two pullup resistors on the CC1 terminal 804 and the CC2 terminal 806.

The PMI 912 pulls down the CC1 terminal 804 and the CC2 terminal 806 through resistors 914, 916, respectively. In one example, the PMI 912 may couple resistors 906, 910 to the CC1 terminal 804 and the CC2 terminal 806. For example, the values of the resistors 906, 910 may be selected from a set of three resistance values: {Rp-std=56 kΩ, Rp-mid=22 kΩ, Rp-high=10 kΩ}. In another example, the PMI 912 may couple current sources 904, 908 to the CC1 terminal 804 and the CC2 terminal 806. For example, the current sources 904, 908 may provide currents of 80 μA, 180 μA, 330 μA. The resistance values measured at the CC1 terminal 804 or the CC2 terminal 806, and/or current flow through the CC1 terminal 804 or the CC2 terminal 806 may indicate a current level available from a source device. In one example, three current levels may be defined in the set {Standard, 1.5 A, 3 A}, and a set of three resistance values (here, the set of Rp-std, Rp-mid, Rp-high resistance values) may be associated with, and be operative to select one of the current levels. Other sets of resistance values may be used to indicate current levels.

The PMI 912 may enter test mode when it detects a valid resistance (or current flow) coupled concurrently to both the CC1 terminal 804 and the CC2 terminal 806. By coupling different combinations of resistance values to the CC1 terminal 804 and the CC2 terminal 806, entry into one of six test modes may be facilitated. FIG. 10 includes a table 1000 illustrating various combinations of factory mode boot (FMB1 and FMB2) detected through Type-C sink debug accessory mode. Six debug modes may be identified using all combinations of two different resistances coupled to the CC1 terminal 804 and the CC2 terminal 806. In the table 1000, the current mode indications 1002, 1004 are provided based on the value of the resistances coupled to the CC1 terminal 804 and the CC2 terminal 806. When different combinations of current mode indications 1002, 1004 are detected, the PMI 912 may determine a factory mode boot based on the combination of current mode indications 1002, 1004.

Examples of Processing Circuits and Methods

Figure 11:
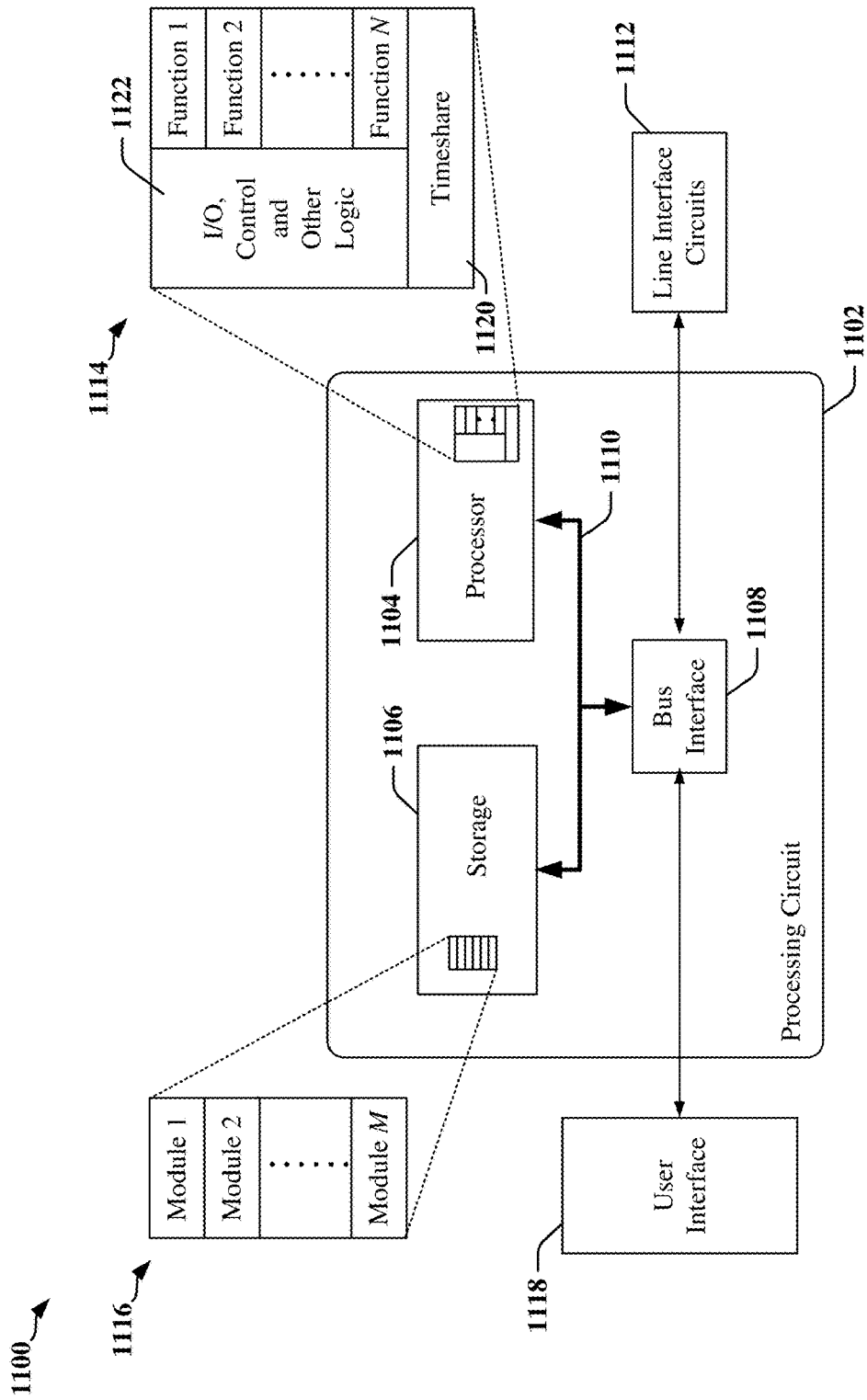
FIG. 11 is a block diagram illustrating an example of an apparatus employing a processing circuit that may be adapted according to certain aspects disclosed herein.

FIG. 11 is a conceptual diagram illustrating a simplified example of a hardware implementation for an apparatus 1100 employing a processing circuit 1102 that may be configured to perform one or more functions disclosed herein. In accordance with various aspects of the disclosure, an element, or any portion of an element, or any combination of elements as disclosed herein may be implemented using the processing circuit 1102. The processing circuit 1102 may include one or more processors 1104 that are controlled by some combination of hardware and software modules. Examples of processors 1104 include microprocessors, microcontrollers, digital signal processors (DSPs), ASICs, field programmable gate arrays (FPGAs), programmable logic devices (PLDs), state machines, sequencers, gated logic, discrete hardware circuits, and other suitable hardware configured to perform the various functionality described throughout this disclosure. The one or more processors 1104 may include specialized processors that perform specific functions, and that may be configured, augmented or controlled by one of the software modules 1116. The one or more processors 1104 may be configured through a combination of software modules 1116 loaded during initialization, and further configured by loading or unloading one or more software modules 1116 during operation.

In the illustrated example, the processing circuit 1102 may be implemented with a bus architecture, represented generally by the bus 1110. The bus 1110 may include any number of interconnecting buses and bridges depending on the specific application of the processing circuit 1102 and the overall design constraints. The bus 1110 links together various circuits including the one or more processors 1104, and storage 1106. Storage 1106 may include memory devices and mass storage devices, and may be referred to herein as computer-readable media and/or processor-readable media. The bus 1110 may also link various other circuits such as timing sources, timers, peripherals, voltage regulators, and power management circuits. A bus interface 1108 may provide an interface between the bus 1110 and one or more transceivers 1112. A transceiver 1112 may be provided for each networking technology supported by the processing circuit. In some instances, multiple networking technologies may share some or all of the circuitry or processing modules found in a transceiver 1112. Each transceiver 1112 provides a means for communicating with various other apparatus over a transmission medium. Depending upon the nature of the apparatus 1100, a user interface 1118 (e.g., keypad, display, speaker, microphone, joystick) may also be provided, and may be communicatively coupled to the bus 1110 directly or through the bus interface 1108.

A processor 1104 may be responsible for managing the bus 1110 and for general processing that may include the execution of software stored in a computer-readable medium that may include the storage 1106. In this respect, the processing circuit 1102, including the processor 1104, may be used to implement any of the methods, functions and techniques disclosed herein. The storage 1106 may be used for storing data that is manipulated by the processor 1104 when executing software, and the software may be configured to implement any one of the methods disclosed herein.

One or more processors 1104 in the processing circuit 1102 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 1106 or in an external computer readable medium. The external computer-readable medium and/or storage 1106 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, a ROM, a programmable read-only memory (PROM), an erasable programmable read-only memory (EPROM), an EEPROM, a register, a removable disk, and any other suitable medium for storing, software and/or instructions that may be accessed and read by a computer. The computer-readable medium and/or storage 1106 may also include, by way of example, a carrier wave, a transmission line, and any other suitable medium for transmitting software and/or instructions that may be accessed and read by a computer. Computer-readable medium and/or the storage 1106 may reside in the processing circuit 1102, in the processor 1104, external to the processing circuit 1102, or be distributed across multiple entities including the processing circuit 1102. The computer-readable medium and/or storage 1106 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 1106 may maintain software maintained and/or organized in loadable code segments, modules, applications, programs, etc., which may be referred to herein as software modules 1116. Each of the software modules 1116 may include instructions and data that, when installed or loaded on the processing circuit 1102 and executed by the one or more processors 1104, contribute to a run-time image 1114 that controls the operation of the one or more processors 1104. When executed, certain instructions may cause the processing circuit 1102 to perform functions in accordance with certain methods, algorithms and processes described herein.

Some of the software modules 1116 may be loaded during initialization of the processing circuit 1102, and these software modules 1116 may configure the processing circuit 1102 to enable performance of the various functions disclosed herein. For example, some software modules 1116 may configure internal devices and/or logic circuits 1122 of the processor 1104, and may manage access to external devices such as the transceiver 1112, the bus interface 1108, the user interface 1118, timers, mathematical coprocessors, and so on. The software modules 1116 may include a control program and/or an operating system that interacts with interrupt handlers and device drivers, and that controls access to various resources provided by the processing circuit 1102. The resources may include memory, processing time, access to the transceiver 1112, the user interface 1118, and so on.

One or more processors 1104 of the processing circuit 1102 may be multifunctional, whereby some of the software modules 1116 are loaded and configured to perform different functions or different instances of the same function. The one or more processors 1104 may additionally be adapted to manage background tasks initiated in response to inputs from the user interface 1118, the transceiver 1112, and device drivers, for example. To support the performance of multiple functions, the one or more processors 1104 may be configured to provide a multitasking environment, whereby each of a plurality of functions is implemented as a set of tasks serviced by the one or more processors 1104 as needed or desired. In one example, the multitasking environment may be implemented using a timesharing program 1120 that passes control of a processor 1104 between different tasks, whereby each task returns control of the one or more processors 1104 to the timesharing program 1120 upon completion of any outstanding operations and/or in response to an input such as an interrupt. When a task has control of the one or more processors 1104, the processing circuit is effectively specialized for the purposes addressed by the function associated with the controlling task. The timesharing program 1120 may include an operating system, a main loop that transfers control on a round-robin basis, a function that allocates control of the one or more processors 1104 in accordance with a prioritization of the functions, and/or an interrupt driven main loop that responds to external events by providing control of the one or more processors 1104 to a handling function.

Figure 12:
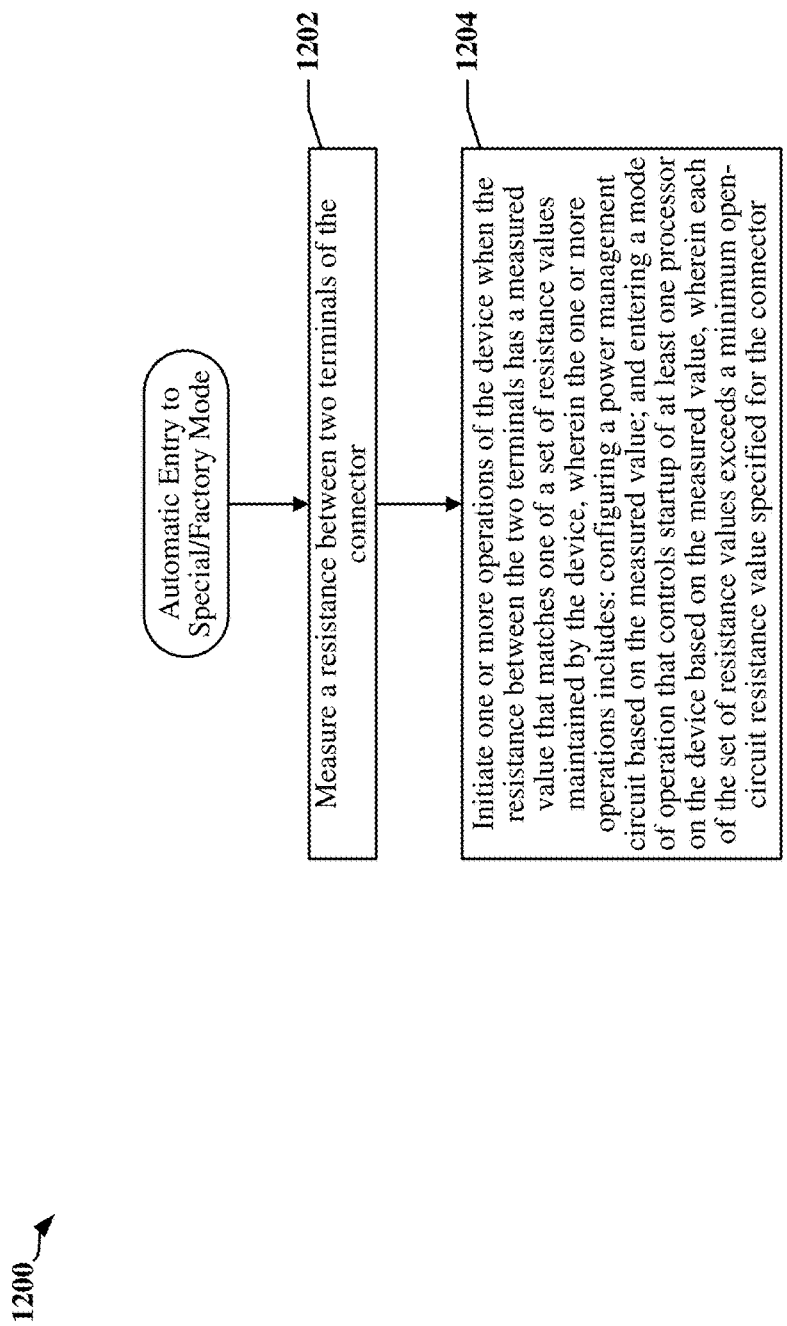
FIG. 12 is a flowchart of a method for factory testing a device equipped with a USB Type-C connector and adapted in accordance with certain aspects disclosed herein.

FIG. 12 is a flowchart 1200 of a method of automatically configuring factory mode support through a connector, such as a USB Type-C connector. The method may be performed at a device that has a connector adapted to support USB communications.

At block 1202, the device may measure a resistance between two terminals of the connector.

At block 1204, the device may initiate one or more operations of the device when the resistance between the two terminals has a measured value that matches one of a set of resistance values maintained by the device. The one or more operations may include configuring a power management circuit based on the measured value, and entering a mode of operation that controls startup of at least one processor on the device based on the measured value. Each of the set of resistance values exceeds a minimum open-circuit resistance value specified for the connector.

In some examples, configuring a power management circuit includes disabling a battery charging circuit when the measured value corresponds to a first resistance value in the set of resistance values, and enabling the battery charging circuit to provide a charging current when the measured value corresponds to a second resistance value in the set of resistance values. Enabling the battery charging circuit may include configuring a direction of flow of the charging current through the connector.

In some examples, configuring a power management circuit includes configuring a current limit associated with a plurality of terminals of the connector.

In some examples, configuring a power management circuit includes configuring a sequence controlling provision of power to one or more components of the device or components coupled to the device.

In some examples, entering a factory boot mode includes loading code into a storage device when the measured value corresponds to a first resistance value in the set of resistance values, and causing a processor of the device to execute one or more instructions from the storage device. The code may include code for an operating system adapted to control operations of the processor. The one or more instructions may initialize the operating system.

In some examples, initiating one or more operations of the device includes configuring an operating mode for at least one terminal of the connector, coupling the at least one terminal to an application processor of the device when the measured value corresponds to a first resistance value in the set of resistance values, and coupling the at least one terminal to a serial communication device when the measured value corresponds to a second resistance value in the set of resistance values.

In some examples, initiating one or more operations of the device includes configuring a plurality of terminals of the connector to support a USB on-the-go mode of operation.

In some examples, initiating one or more operations of the device includes initializing test mode for the device independently of an external test system when the measured value matches one of the set of resistance values. The connector is compliant or compatible with specifications for a USB Type-C connector.

Figure 13:
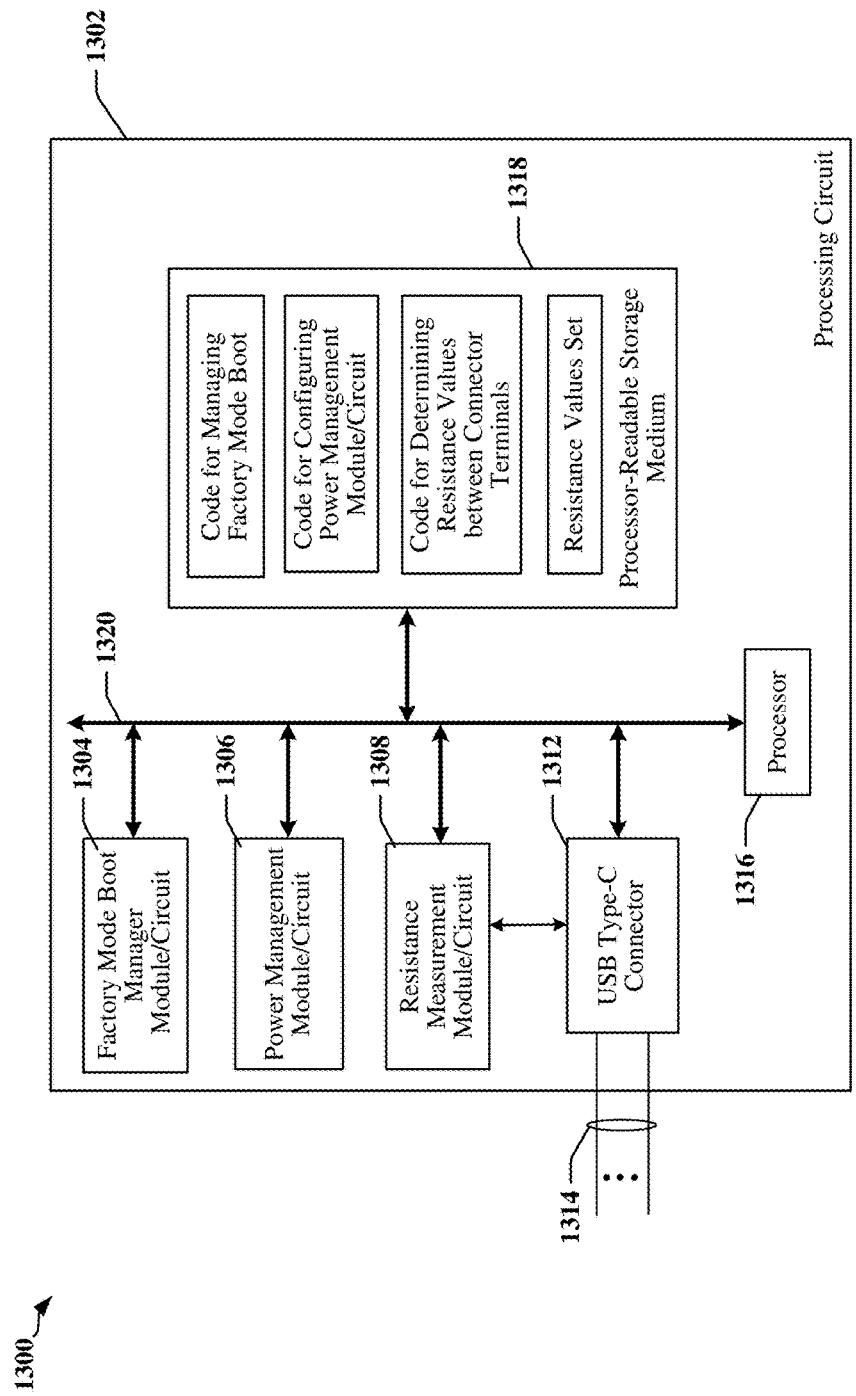
FIG. 13 is a diagram illustrating an example of a hardware implementation for an apparatus to automatically configure a factory test mode according to certain aspects disclosed herein.

FIG. 13 is a diagram illustrating a simplified example of a hardware implementation for an apparatus 1300 employing a processing circuit 1302. The processing circuit typically has a processor 1316 that may include one or more of a microprocessor, microcontroller, digital signal processor, a sequencer and a state machine. The processing circuit 1302 may be implemented with a bus architecture, represented generally by the bus 1320. The bus 1320 may include any number of interconnecting buses and bridges depending on the specific application of the processing circuit 1302 and the overall design constraints. The bus 1320 links together various circuits including one or more processors and/or hardware modules, represented by the processor 1316, the modules or circuits 1304, 1306 and 1308 and the computer-readable storage medium 1318. The apparatus may have a connector 1312 adapted to communicate over a plurality of interconnects or wires 1314. In one example, the connector 1312 may be a USB Type-C connector adapted to couple the apparatus 1300 to another device in accordance with one or more USB protocols. The bus 1320 may also link various other circuits such as timing sources, peripherals, voltage regulators, and power management circuits, which are well known in the art, and therefore, will not be described any further.

The processor 1316 is responsible for general processing, including the execution of software, code and/or instructions stored on the computer-readable storage medium 1318. The computer-readable storage medium may include a non-transitory storage medium. The software, when executed by the processor 1316, causes the processing circuit 1302 to perform the various functions described supra for any particular apparatus. The computer-readable storage medium may be used for storing data that is manipulated by the processor 1316 when executing software, including software, code and/or instructions loaded through the connector 1312. The processing circuit 1302 further includes at least one of the modules 1304, 1306 and 1308. The modules 1304, 1306 and 1308 may be software modules running in the processor 1316, resident/stored in the computer-readable storage medium 1318, one or more hardware modules coupled to the processor 1316, or some combination thereof. The modules 1304, 1306 and/or 1308 may include microcontroller instructions, state machine configuration parameters, or some combination thereof.

In one configuration, the apparatus 1300 includes a measurement module and/or circuit 1308 configured to provide a measured resistance value corresponding to the resistance between two terminals of the connector 1312, and a power management module and/or circuit 1306 adapted to control power distribution within the apparatus 1300. The processor 1316 may be configured to initiate one or more operations when the measured resistance value matches one of a set of resistance values maintained by the apparatus 1300. The one or more operations may include configuring the power management module and/or circuit 1306 based on the measured resistance value, and cause a factory/special mode boot manager module and/or circuit 1304 to initiate a mode of operation that is selected based on the measured resistance value. The set of resistance values may exceed a minimum open-circuit resistance value specified for the connector 1312.

In some examples, the apparatus 1300 includes, or is coupled to, a battery charging circuit. The processor 1316 may be configured to cause the power management module and/or circuit 1306 to disable the battery charging circuit when the measured resistance value corresponds to a first resistance value in the set of resistance values. The processor 1316 may be configured to cause the power management circuit to enable the battery charging circuit to provide a charging current when the measured resistance value corresponds to a second resistance value in the set of resistance values. The resistance values may be maintained in the computer-readable storage medium 1318.

In some examples, the processor 1316 may configure a direction of flow of the charging current through the connector based on the measured resistance value. The processor 1316 may configure current limits associated with a plurality of terminals of the connector 1312 based on the measured resistance value. The processor 1316 may cause the power management module and/or circuit 1306 to implement a power sequence controlling provision of power to one or more components of the apparatus 1300 or components coupled to the apparatus 1300.

In some examples, the processor 1316 may be configured to execute one or more instructions from a computer-readable storage medium 1318 after entering a first factory boot mode or after entering a second factory boot mode. The one or more instructions may be loaded into the computer-readable storage medium 1318 after the first factory boot mode is initiated. The one or more instructions may be loaded into the computer-readable storage medium 1318 before the second factory boot mode is initiated. The one or more instructions may include instructions related to an operating system adapted to control operations of the processor 1316. The one or more instructions may initialize the operating system.

In some examples, the processor 1316 may be configured to automatically configure an operating mode for at least one terminal of the connector 1312 based on the measured resistance value, couple the at least one terminal to an application processor of the apparatus 1300 when the measured resistance value corresponds to a first resistance value in the set of resistance values, and couple the at least one terminal to a serial communication device when the measured resistance value corresponds to a second resistance value in the set of resistance values. The serial communication device may be a UART.

In some examples, the processor 1316 may be configured to enter a test mode independently of an external test system 220 when the measured resistance value matches one of the set of resistance values. The connector 1312 may be compliant with or compatible with specifications for a USB Type-C connector.

Figure 14:
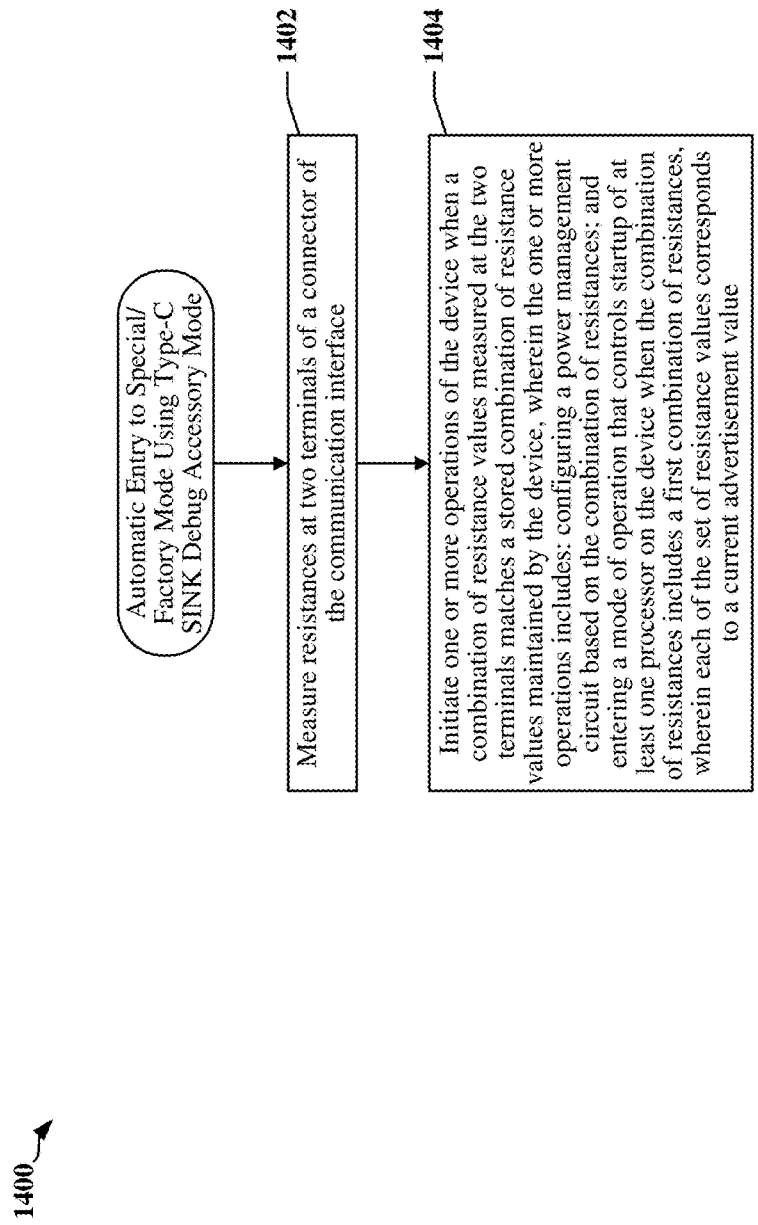
FIG. 14 is a flowchart of a method of automatically configuring factory mode support automatic entry to special/factory mode using USB Type-C SINK debug accessory mode in accordance with certain aspects disclosed herein.

FIG. 14 is a flowchart 1400 of a method of automatically configuring factory mode support automatic entry to special/factory mode using USB Type-C SINK debug accessory mode. The method may be performed at a device that has a Type-C connector adapted to support USB communications.

At block 1402, the device may measure resistances at two terminals of a connector of the communication interface.

At block 1404, the device may initiate one or more operations of the device when a combination of resistance values measured at the two terminals matches a stored combination of resistance values maintained by the device. The one or more operations may include configuring a power management circuit based on the combination of resistances. The one or more operations may include entering a mode of operation that controls startup of at least one processor on the device when the combination of resistances includes a first combination of resistances. The one or more operations may be initiated when each of the resistance values measured at the two terminals corresponds to a current advertisement value. A set of resistance values may be maintained by the device, where, each resistance in the set of resistance values corresponds to a current advertisement value.

In some examples, configuring the power management circuit includes disabling a battery charging circuit when the combination of resistances corresponds to a second combination of resistances. In some examples, configuring the power management circuit includes enabling the battery charging circuit to provide a charging current when the combination of resistances corresponds to a third combination of resistances.

In one example, the two terminals include a CC1 terminal and a CC2 terminal.

In various examples, of claim 1, configuring the power management circuit includes disconnecting a battery of the device when the combination of resistances corresponds to a second combination of resistances. Configuring the power management circuit may include configuring a current limit associated with a plurality of terminals of the connector based on the combination of resistances. Configuring the power management circuit may include configuring a sequence controlling provision of power to one or more components of the device or components coupled to the device.

In one example, entering the mode of operation includes loading code into a storage device when the combination of resistances corresponds to a second combination of resistances, and causing a processor of the device to execute one or more instructions from the storage device. The code may include code for an operating system adapted to control operations of the processor. The one or more instructions may initialize the operating system.

In various examples, initiating one or more operations of the device includes configuring an operating mode for at least one terminal of the connector. At least one terminal may be coupled to an application processor of the device when the combination of resistances corresponds to a second combination of resistances. At least one terminal may be coupled to a serial communication device when the combination of resistances corresponds to a second combination of resistances. Initiating one or more operations of the device may include configuring a plurality of terminals of the connector to support a universal serial bus on-the-go mode of operation or a universal serial bus dual-role mode of operation. Initiating one or more operations of the device may include initializing a test mode for the device independently of an external test system when the combination of resistances matches one of a set of combinations of resistances. The connector may be compliant or compatible with specifications for a universal serial bus Type-C connector.

In some instances, the method includes measuring a resistance coupled to at least one terminal of a connector of the communication interface, and initiating one or more operations of the device when the resistance coupled to the at least one terminal of the connector has a measured value that matches one of a set of resistance values maintained by the device. The one or more operations may include configuring a power management circuit based on the measured value, and entering a mode of operation that controls startup of at least one processor on the device when the measured value matches a first resistance value.

In one example, each resistance value in the set of resistance values exceeds a minimum open-circuit resistance value specified for the connector.

In another example, at least one terminal comprises a CC1 terminal and a CC2 terminal of a Type-C connector. The one or more operations may be initiated when resistance values measured at the CC1 terminal and the CC2 terminal correspond to different current advertisement resistance values.

In some examples, entering the mode of operation includes loading code into a storage device, and causing a processor of the device to execute one or more instructions from the storage device.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The invention claimed is:

1. A method performed at a device that includes a communication interface, comprising:
    measuring resistances at two terminals of a connector of the communication interface; and
    initiating one or more operations of the device when each of the resistances measured at the two terminals has a value that corresponds to a current advertisement value, wherein initiating the one or more operations includes:
        configuring a power management circuit when at least one of the resistances measured at the two terminals has a value that is listed in a set of preconfigured resistance values known to the device; and
        entering a mode of operation that controls startup of a processing circuit on the device when a first combination of resistance values is measured at the two terminals.

2. The method of claim 1, wherein configuring the power management circuit comprises:
    disabling a battery charging circuit when a second combination of resistances is measured at the two terminals; and
    enabling the battery charging circuit to provide a charging current when a third combination of resistances is measured at the two terminals.

3. The method of claim 1, wherein the two terminals include a CC1 terminal and a CC2 terminal.

4. The method of claim 1, wherein configuring the power management circuit comprises:
    disconnecting a battery of the device when a second combination of resistances is measured at the two terminals.

5. The method of claim 1, wherein configuring the power management circuit comprises:
    configuring a current limit associated with a plurality of terminals of the connector based on the combination of resistances.

6. The method of claim 1, wherein configuring the power management circuit comprises:
    configuring a sequence controlling provision of power to one or more components of the device or components coupled to the device.

7. The method of claim 1, wherein entering the mode of operation comprises:
    loading code into a storage device when a second combination of resistances is measured at the two terminals; and
    causing a processor of the device to execute one or more instructions from the storage device.

8. The method of claim 7, wherein the code includes code for an operating system adapted to control operations of the processor, and wherein the one or more instructions initialize the operating system.

9. The method of claim 1, wherein initiating the one or more operations of the device comprises:
    configuring an operating mode for the connector;
    coupling the connector to a processor of the device when a second combination of resistances is measured at the two terminals; and
    coupling the connector to a serial communication device when a third combination of resistances is measured at the two terminals.

10. The method of claim 1, wherein initiating one or more operations of the device comprises:
    configuring a plurality of terminals of the connector to support a universal serial bus on-the-go mode of operation or a universal serial bus dual-role mode of operation.

11. The method of claim 1, wherein initiating one or more operations of the device comprises:
    initializing a test mode for the device independently of an external test system when the combination of the resistances measured at the two terminals matches one of a set of combinations of resistances known to the device, wherein the connector is compliant or compatible with specifications for a universal serial bus Type-C connector.

12. An apparatus comprising:
    a connector adapted to couple the apparatus to another device in accordance with a communication protocol;

a measurement circuit configured to provide a mode indicator corresponding to a combination of resistance values measured at two terminals of the connector;
a power management circuit adapted to control power distribution within the apparatus; and
a processor,
wherein the apparatus is configured to:
configure the power management circuit based on the mode indicator; and
initiate a mode of operation of the apparatus when the mode indicator matches one of a set of mode indicators maintained by the apparatus,
wherein the mode indicator is provided when each of the resistances measured at the two terminals corresponds to a current advertisement value.

13. The apparatus of claim 12, wherein the apparatus is configured to:
cause the power management circuit to disable a battery charging circuit when the mode indicator corresponds to a first mode indicator in the set of mode indicators; and
cause the power management circuit to enable the battery charging circuit to provide a charging current when the mode indicator corresponds to a second mode indicator in the set of mode indicators.

14. The apparatus of claim 13, wherein the two terminals include a CC1 terminal and a CC2 terminal.

15. The apparatus of claim 12, wherein the apparatus is configured to:
configure current limits associated with a plurality of terminals of the connector based on the mode indicator.

16. The apparatus of claim 12, wherein the apparatus is configured to:
cause the power management circuit to implement a power sequence controlling provision of power to one or more components of the apparatus or components coupled to the apparatus.

17. The apparatus of claim 12, wherein the processor is configured to:
execute one or more instructions from a storage device after entering a first factory boot mode or after entering a second factory boot mode,
wherein the one or more instructions are loaded into the storage device after the first factory boot mode is initiated, and wherein the one or more instructions are loaded into the storage device before the second factory boot mode is initiated.

18. The apparatus of claim 17, wherein the one or more instructions includes instructions related to an operating system adapted to control operations of the processor, and wherein the one or more instructions initialize the operating system.

19. The apparatus of claim 12, wherein the apparatus is adapted to:
configure an operating mode for at least one terminal of the connector based on the mode indicator;
couple the processor to the connector when the mode indicator corresponds to a first mode indicator in the set of mode indicators; and
couple the connector to a serial communication device when the mode indicator corresponds to a second mode indicator in the set of mode indicators.

20. The apparatus of claim 12, wherein the apparatus is configured to:
enter a test mode independently of an external test system when the mode indicator matches one of the set of mode indicators, wherein the connector is compliant or compatible with specifications for a universal serial bus Type-C connector.

21. The apparatus of claim 12, further comprising:
a battery, wherein the processor is configured to electrically disconnect the battery from the apparatus when the mode indicator corresponds to a first mode indicator in the set of mode indicators.

22. An apparatus comprising:
means for measuring resistances at two terminals of a connector; and
means for initiating one or more operations of the apparatus, the means for initiating the one or more operations being configured to:
configure a power management circuit when resistances measured at the two terminals have a combination of resistance values that matches a stored combination of resistance values maintained by the apparatus; and
enter a mode of operation that controls startup of at least one processing circuit on the apparatus when a first combination of resistance values is measured at the two terminals,
wherein the one or more operations are initiated when each of the resistance values measured at the two terminals corresponds to a current advertisement value.

23. The apparatus of claim 22, wherein the means for initiating one or more operations of the apparatus is configured to:
disable a battery charging circuit when a second combination of resistance values is measured at the two terminals; and
enable the battery charging circuit to provide a charging current when a third combination of resistance values is measured at the two terminals.

24. The apparatus of claim 22, wherein the two terminals include a CC1 terminal and a CC2 terminal.

25. The apparatus of claim 22, wherein the means for initiating one or more operations of the apparatus is configured to:
configure a sequence controlling provision of power to one or more components of the apparatus or components coupled to the apparatus; and
initialize a test mode for the apparatus independently of an external test system when the resistances measured at the two terminals have values that match a first combination of resistance values maintained by the apparatus, wherein the connector is compliant or compatible with specifications for a universal serial bus Type-C connector.

26. The apparatus of claim 25, wherein the means for initiating one or more operations of the apparatus is configured to:
load code into a storage device when resistances measured at the two terminals have values that match a second combination of resistance values maintained by the apparatus; and
cause a processor of the apparatus to execute one or more instructions from the storage device,
wherein the code includes code for an operating system adapted to control operations of the processor, and wherein the one or more instructions initialize the operating system.

27. A method performed at a device that includes a communication interface, comprising:
measuring a resistance coupled to at least one terminal of a connector of the communication interface; and initiating one or more operations of the device when the resistance coupled to the at least one terminal of the connector has a measured value that matches one of a set of resistance values maintained by the device, wherein the one or more operations includes:
configuring a power management circuit based on the measured value; and
entering a mode of operation that controls startup of a processing circuit of the device when the measured value matches a first resistance value.

28. The method of claim 27, wherein each resistance value in the set of resistance values exceeds a minimum open-circuit resistance value specified for the connector.

29. The method of claim 27, wherein the at least one terminal comprises a CC1 terminal and a CC2 terminal, and wherein the one or more operations are initiated when resistance values measured at the CC1 terminal and the CC2 terminal correspond to different current advertisement resistance values.

30. The method of claim 27, wherein entering the mode of operation comprises:
loading code into a storage device; and
causing a processor of the device to execute one or more instructions from the storage device.

* * * * *